(12) United States Patent
Sato

(10) Patent No.: US 10,403,616 B2
(45) Date of Patent: Sep. 3, 2019

(54) METHOD OF MANUFACTURING A SEMICONDUCTOR DEVICE

(71) Applicant: FUJI ELECTRIC CO., LTD., Kawasaki-shi, Kanagawa (JP)

(72) Inventor: Kenichiro Sato, Shiojiri (JP)

(73) Assignee: FUJI ELECTRIC CO., LTD., Kawasaki-shi, Kanagawa (JP)

(*) Notice: Subject to any disclaimer, the term of this patent is extended or adjusted under 35 U.S.C. 154(b) by 0 days.

(21) Appl. No.: 15/971,274

(22) Filed: May 4, 2018

(65) Prior Publication Data

US 2018/0254267 A1 Sep. 6, 2018

Related U.S. Application Data

(62) Division of application No. 14/620,184, filed on Feb. 11, 2015, now Pat. No. 9,991,242.

(30) Foreign Application Priority Data

Mar. 7, 2014 (JP) ................................ 2014-044683

(51) Int. Cl.
*H01L 21/52* (2006.01)
*H01L 25/18* (2006.01)
(Continued)

(52) U.S. Cl.
CPC ........ *H01L 25/18* (2013.01); *H01L 21/67121* (2013.01); *H01L 21/67259* (2013.01);
(Continued)

(58) Field of Classification Search
CPC ....... H01L 25/18; H01L 25/072; H01L 24/37; H01L 24/77; H01L 24/40; H01L 24/84;
(Continued)

(56) References Cited

U.S. PATENT DOCUMENTS 5,195,237 A * 3/1993 Cray .................. H01L 21/4853
29/838
6,297,549 B1 10/2001 Hiyoshi
(Continued)

FOREIGN PATENT DOCUMENTS

JP S60-178656 A 9/1985
JP H11-177204 A 7/1999
(Continued)

*Primary Examiner* — Cuong B Nguyen
*Assistant Examiner* — Samuel Park
(74) *Attorney, Agent, or Firm* — Rabin and Berdo, P.C.

(57) ABSTRACT

A method of manufacturing a semiconductor device that includes an insulated circuit board having a conductive pattern, a first semiconductor chip with a rectangular shape connected through a first joining material to the conductive pattern, a second semiconductor chip with a rectangular shape disposed on the conductive pattern separated from the first semiconductor chip and connected through a second joining material to the conductive pattern, a terminal disposed above the semiconductor chips, respectively connected to the first and second semiconductor chips through third and fourth joining materials, the terminal having a through-hole above a place between the first and second semiconductor chips, the method including a positioning step in which the first and second semiconductor chips are respectively positioned at at least three positioning places, and at least one of the positioning places is positioned with a positioning member inserted into the through-hole.

12 Claims, 19 Drawing Sheets

(51) Int. Cl.
*H01L 21/67* (2006.01)
*H01L 23/495* (2006.01)
*H01L 23/00* (2006.01)
*H01L 25/00* (2006.01)
*H01L 25/07* (2006.01)

(52) U.S. Cl.
CPC .. *H01L 23/49541* (2013.01); *H01L 23/49579* (2013.01); *H01L 24/09* (2013.01); *H01L 24/37* (2013.01); *H01L 24/40* (2013.01); *H01L 24/77* (2013.01); *H01L 24/84* (2013.01); *H01L 24/85* (2013.01); *H01L 25/072* (2013.01); *H01L 25/50* (2013.01); *H01L 24/05* (2013.01); *H01L 24/48* (2013.01); *H01L 24/49* (2013.01); *H01L 2224/04042* (2013.01); *H01L 2224/05554* (2013.01); *H01L 2224/0603* (2013.01); *H01L 2224/371* (2013.01); *H01L 2224/37011* (2013.01); *H01L 2224/37124* (2013.01); *H01L 2224/37147* (2013.01); *H01L 2224/37599* (2013.01); *H01L 2224/40095* (2013.01); *H01L 2224/40225* (2013.01); *H01L 2224/40227* (2013.01); *H01L 2224/45015* (2013.01); *H01L 2224/48091* (2013.01); *H01L 2224/48227* (2013.01); *H01L 2224/49171* (2013.01); *H01L 2224/73221* (2013.01); *H01L 2224/73271* (2013.01); *H01L 2224/77272* (2013.01); *H01L 2224/77702* (2013.01); *H01L 2224/77705* (2013.01); *H01L 2224/80121* (2013.01); *H01L 2224/80136* (2013.01); *H01L 2224/80815* (2013.01); *H01L 2224/85121* (2013.01); *H01L 2224/85136* (2013.01); *H01L 2224/85801* (2013.01); *H01L 2924/00014* (2013.01); *H01L 2924/13055* (2013.01); *H01L 2924/172* (2013.01); *H01L 2924/17724* (2013.01); *H01L 2924/17747* (2013.01)

(58) Field of Classification Search
CPC ... H01L 23/49579; H01L 24/85; H01L 25/50; H01L 21/67259; H01L 23/49541; H01L 21/67121; H01L 24/09; H01L 2224/45015; H01L 2224/37124; H01L 2224/371; H01L 2224/37599; H01L 2224/37147; H01L 2224/37011; H01L 2224/77272; H01L 2924/13055; H01L 2224/73221; H01L 2224/40225; H01L 2224/40227; H01L 2224/48227; H01L 2224/48091; H01L 2224/0603; H01L 2224/05554; H01L 2224/49171; H01L 2224/77705; H01L 24/48; H01L 2224/77702; H01L 2224/73271; H01L 24/05; H01L 2224/40095; H01L 2924/00014; H01L 2924/17724; H01L 2224/80815; H01L 2224/85121; H01L 2224/85136; H01L 2224/80121; H01L 2224/80136; H01L 2224/85801; H01L 24/49; H01L 2924/172; H01L 2924/17747; H01L 2224/04042
See application file for complete search history.

(56) References Cited

U.S. PATENT DOCUMENTS

| | | |
|---|---|---|
| 2002/0027283 A1 | 3/2002 | Hiyoshi |
| 2008/0191325 A1 | 8/2008 | Shirasaka |
| 2010/0193921 A1 | 8/2010 | Jereza et al. |
| 2014/0159216 A1 | 6/2014 | Ishino et al. |

FOREIGN PATENT DOCUMENTS

| | | |
|---|---|---|
| JP | H11-330283 A | 11/1999 |
| JP | 2007-194477 A | 8/2007 |
| JP | 2012-129336 A | 7/2012 |
| JP | 2013-038309 A | 2/2013 |

* cited by examiner

21a(21)

X      X

21a(21)

METHOD OF MANUFACTURING A SEMICONDUCTOR DEVICE

CROSS-REFERENCE TO RELATED APPLICATION

This application is a division of U.S. application Ser. No. 14/620,184, filed on Feb. 11, 2015, and allowed on Feb. 7, 2018, which is based upon and claims the benefit of priority from Japanese Patent Application No. 2014-044683, filed on Mar. 7, 2014. The entire disclosures of these prior U.S. and foreign applications are incorporated herein by reference.

BACKGROUND OF THE INVENTION

1. Field of the Invention

The present invention relates to a positioning jig for use in manufacturing a power semiconductor module, for example, a semiconductor device manufactured by using the jig, and a method of manufacturing the semiconductor device.

2. Description of the Related Art

FIG. 16A and FIG. 16B show a part of a conventional power semiconductor module 500, wherein FIG. 16A is a plan view and FIG. 16B is a side view seen from the arrow A indicated in FIG. 16A. These figures show intermediate product structure within a resin casing.

The power semiconductor module 500 comprises: an insulated circuit board 53 having a conductive pattern, such as a direct copper bonding (DCB); an IGBT chip 51 and a silicon diode chip 52 soldered onto a conductive pattern 53c of the insulated circuit board 53 having a conductive pattern; a first terminal 54 soldered onto the IGBT chip 51 and the silicon diode chip 52; and a second terminal 55 soldered onto the conductive pattern 53c. The power semiconductor module 500 further comprises bonding wires 57 connecting at one end thereof to gate electrode pads 56 of the IGBT chip 51, and pad electrodes 58 to which the other ends of the bonding wires 57 are connected. Though not depicted, the power semiconductor module 500 is provided with externally leading out terminals connected to the first terminal 54 and the second terminal 55, and control pins soldered to the pad electrodes 58. The power semiconductor module 500 also has a resin casing that seals the whole of the power semiconductor module 500 except for exposing tip portions of the externally leading out terminals and the control pins. The first terminal 54 is connected to the front surfaces of the IGBT chip 51 and the silicon diode chip 52 with solder. The second terminal 55 is connected to the conductive pattern 53c with solder. The front surface and the back surface of the IGBT chip 51 and the silicon diode chip 52 are interposed between the first terminal 54 and the conductive pattern 53c.

In the process of manufacturing a power semiconductor module 500 mounting an IGBT chip 51 and Si diode chip 52, an intermediate product called a power cell 501 is first assembled. The power cell 501 has the IGBT chip 51 and the Si diode chip 52, the back surfaces of which are soldered on the insulated circuit board 53 having a conductive pattern. The power cell 501 has also a first terminal 54 of a copper lead-frame that is soldered to an emitter electrode 51a of the IGBT chip 51 and an anode electrode 52a of the Si diode chip 52. The power cell 501 further has a second terminal 55 soldered to the insulated circuit board 53 having a conductive pattern. The power cell 501 is tested for its static and dynamic characteristics. The test contributes to improvement of a rate of non-defective units of completed power semiconductor modules 500. The insulated circuit board 53 having a conductive pattern is composed of an insulation plate 53a, a conductive foil 53b on the back surface thereof, and a conductive pattern 53c on the front surface thereof.

FIG. 17 is a plan view of a part of a positioning jig 600 for use in assembling a power semiconductor module 500 of FIG. 16A and FIG. 16B. In the process of assembling a power cell 501 constructing the power semiconductor module 500, a positioning jig 600 is used that is dedicated to each power semiconductor module 500 comprising the components of the IGBT chip 51, the Si diode chip 52, the solder plates (not depicted) for use in soldering the IGBT 51 and the Si diode chip 52, the first terminal 54, and the second terminal 55. Use of the dedicated positioning jig 600 prevents the components from shifting off their positions.

The positioning jig 600 has a first opening 61 for positioning the IGBT chip 51, the Si diode chip 52, and the solder plates (not depicted) used for soldering the IGBT chip 51 and the Si diode chip 52, and a second opening 62 for positioning the second terminal 55. There are three first openings 61 and two second openings 62. Here, description about a positioning jig for positioning the first terminal 54 is omitted because that jig is not involved in positioning of the chips.

Positional shift of the chips is avoided by holding four corners A, B, C, and D of the IGBT chip 51 and the Si diode chip 52 corresponding to the four corners in the first opening 61.

If the soldering process is conducted without using the positioning jig 600 and the IGBT chip 51 and the Si diode chip 52 shift their position, the following step, for example, soldering of the first terminal 54, cannot be conducted, inhibiting manufacture of a power semiconductor module 500. Even if the soldering process is managed to be done, it becomes very hard to achieve designed performance such as current carrying capacity and thermal resistance because of the positional shift.

In addition, if the positional shift is so large that the adjacent chips become in contact with each other, molten solder may run over the chip surface, inviting deterioration of a breakdown voltage.

The patent documents mentioned below disclose examples of using a positioning jig in the process of assembling a power semiconductor module.

Patent Document 1 discloses a semiconductor device in which a first recessed part for mounting a semiconductor chip is formed on a conductive pattern of an insulated circuit board having a conductive pattern. A positioning external terminal used for positioning and connected to the conductive pattern penetrates through a through-hole in a printed circuit board having post pins, thereby positioning the tips of the post pins on a gate pad and an emitter electrode pad of the semiconductor chip. This construction has remarkably improved the positioning accuracy of the post pins on the pad at a low cost. A solder material and a semiconductor chip are mounded on the first recessed part formed in the conductive pattern of the insulated circuit board having a conductive pattern. A solder is placed on a fourth recessed part. Positioning is performed by inserting two dedicated positioning pins connected to the printed circuit board having post pins into the fourth recessed part in the conductive pattern.

Patent Document 2 discloses a mounting jig used for mounting a ball grid allay (BGA) package having a multiple of lands having a solder ball for an electric connection beneath the package onto a printed circuit board. The mounting jig comprises a frame structure that restrains the movement in the direction perpendicular to the mounting direction while allowing the movement in the mounting direction of the BGA package, and that constrains important parts of the periphery of the BGA package. The frame structure has pins capable of engaging to positioning holes formed on the printed circuit board. This construction allows the BGA package to be packaged readily and accurately at a low cost by worker's handling without changing the structure of the BGA package itself. The construction of Patent Document 2 includes the frame structure that has pins linkable to the positioning hole formed in the printed circuit board.

Patent Document 3 discloses a positioning jig having a first jig and a second jig described below.

The first jig has a positioning hole, or an opening, in which a solder sheet and a semiconductor device element can be inserted. The positioning hole is disposed above a circuit board to correspond to a metal circuit. The second jig is able to insert into and remove from the positioning hole. The second jig has a pressing surface that is disposed opposing the metal circuit in a condition of inserted into the positioning hole of the second jig and pressing the semiconductor device element on a solder sheet onto the circuit substrate side. The second jig is positioned by the wall surface of the positioning hole so that the pressing surface is arranged opposing the metal circuit when the second jig is inserted into the positioning hole.

[Patent Document 1]
Japanese Unexamined Patent Application Publication No. 2012-129336, FIG. 10 and paragraphs 0087-0090, in particular

[Patent Document 2]
Japanese Unexamined Patent Application Publication No. H11-177204

[Patent Document 3]
Japanese Unexamined Patent Application Publication No. 2007-194477

Recently, next generation power semiconductor devices have begun to use silicon carbide (SiC) diodes. The SiC diodes are mainly used for producing smaller chips, for example 3 mm square, than the traditional silicon diodes, because of the higher cost of a SiC substrate than a traditional silicon substrate, and a degraded rate of non-defective units due to defects in the SiC substrate. Large sized chips are readily affected by the lattice defects, lowering the rate of non-defective units and raising the chip cost. As a consequence, a single silicon diode chip is replaced by a multiple of, say six, SiC diodes. Thus, it is needed to connect a multiple of small sized SiC diode chips in parallel.

FIG. 18A and FIG. 18B show construction of a positioning jig 70 having the number of, six in this example, first openings 71 corresponding to the number of small-sized SiC diode chips 81, wherein FIG. 18A is a plan view corresponding to FIG. 17, and FIG. 18B is an enlarged view of the region F indicated in FIG. 18A.

This positioning jig 70 has: three sets of six first openings 71 each for positioning the six SiC diode chips 81, three sets of one second opening 72 each for positioning an IGBT chip 51, and two third openings 73 each for positioning a second terminal 75. As mentioned earlier, description is omitted about the positioning jig for positioning the first terminal, which is not involved in positioning of the chips. Using this positioning jig 70, the four sides of the SiC diode chip 81 are surrounded by the side walls of the first opening 71 and the SiC diode chip 81 is positioned at its four corners corresponding to the four corners of the first opening 71.

However, if the first terminal 74 is connected to the upper surfaces of the six SiC diode chips 81 altogether using this positioning jig 70, the positioning jig 70 becomes unable to be removed after completion of soldering process obstructed by the first terminal 74.

FIG. 19 is a plan view of a part of a positioning jig 90 that is allowed to be removed without obstruction of the first terminal 92. FIG. 19 corresponds to FIG. 18B. The positioning jig 90 has an opening 91 expanding over the whole region beneath the first terminal 92. Any portion of the positioning jig 90 never exists under the first terminal 92. This positioning jig 90 is allowed to be removed after soldering the first terminal 92 without obstruction by the first terminal 92.

However, this positioning jig 90 does not position all of the four corners A, B, C, and D of the SiC diode chip 81 like the positioning jig 70, but positions only three corners A, B, and C leaving the corner D not positioned. Thus, a SiC diode chip 81 floating on the molten solder may move to the position indicated by the dotted line and become in contact with the adjacent SiC diode chip 81. When two SiC diode chips 81 become in contact with each other, the molted solder may run over the front surface of the SiC diode chip 81, causing deteriorated breakdown voltage. Thus, shift of the chip occurs in the process of soldering because the corner D of the SiC diode chip 81 is not positioned, hardly achieving high accuracy positioning of the SiC diode chip 81.

All of the Patent Documents 1 through 3 fail to mention a semiconductor device in which a plurality of small-sized semiconductor chips are connected to both an insulated circuit board having a conductive pattern and a terminal simultaneously through respective joining materials.

SUMMARY OF THE INVENTION

An object of the present invention is to solve the problems described above and to provide a semiconductor device having a plurality of small-sized semiconductor chips connected in parallel between an insulated circuit board having a conductive pattern, and a terminal, the semiconductor chips being positioned with high accuracy. The present invention also provides a method of manufacturing the semiconductor device and a positioning jig for use in manufacturing the semiconductor device.

To attain the above object, a semiconductor device of the invention comprises: an insulated circuit board having a conductive pattern; a first semiconductor chip with a rectangular shape connected through a first joining material to the conductive pattern; a second semiconductor chip with a rectangular shape disposed on the conductive pattern separated from the first semiconductor chip and connected through a second joining material to the conductive pattern; a terminal disposed above the first semiconductor chip and the second semiconductor chip, connected to the first semiconductor chip through a third joining material, and connected to the second semiconductor chip through a fourth joining material, the terminal having a through-hole above a place between the first semiconductor chip and the second semiconductor chip.

This construction allows a positioning jig that is in contact with the first semiconductor chip and the second semiconductor chip to be inserted through the through-hole, thus determining the positions of the first semiconductor chip and the second semiconductor chip with high accuracy.

In the semiconductor device of the invention, a gap between opposing sides of the first semiconductor chip and the second semiconductor chip is preferably in the range from 0.2 mm to 2 mm.

This construction prevents the first joining material and the second joining material from fusing with one another. If the gap is smaller than 0.2 mm, the first joining material and the second joining material tend to readily fuse with one another; if the gap is wider than 2 mm, disadvantage of larger size of the semiconductor device results.

In the semiconductor device of the invention, the terminal is preferably a lead frame made of copper, a copper alloy, aluminum, or an aluminum alloy.

This construction allows forming the terminals by forming a lead frame connecting a plurality of terminals outside and cut the terminals after the terminals are fixed with the joining materials. Therefore, the terminals are readily handled.

In the semiconductor device of the invention, the first joining material and the second joining material is soft solder or brazing filler metal.

This construction allows joining work to be carried out altogether in a reflow furnace.

A method of manufacturing a semiconductor device of the invention is a method of manufacturing such a semiconductor device that comprises: an insulated circuit board having a conductive pattern; a first semiconductor chip with a rectangular shape connected through a first joining material to the conductive pattern; a second semiconductor chip with a rectangular shape disposed on the conductive pattern separated from the first semiconductor chip and connected through a second joining material to the conductive pattern; a terminal disposed above the first semiconductor chip and the second semiconductor chip, connected to the first semiconductor chip through a third joining material, and connected to the second semiconductor chip through a fourth joining material; the terminal having a through-hole above a place between the first semiconductor chip and the second semiconductor chip, the method comprising a positioning step in which the first semiconductor chip is positioned at at least three places, the second semiconductor chip is positioned at at least three places, and at least one of the three positioning places is positioned with a positioning member inserted into the through-hole.

This construction of the method improves positioning accuracy of the semiconductor chip.

The method of the invention of manufacturing a semiconductor device preferably comprises a positioning step that positions: two sides composing a corner of the first semiconductor chip; two sides composing a corner of the second semiconductor chip, the corner being not facing to the first semiconductor chip; a corner at a diagonal position of the corner of the first semiconductor chip; and a corner at a diagonal position of the corner of the second semiconductor chip.

This construction of the method of the invention makes each of the first semiconductor chip and the second semiconductor chip positioned at two sides and one corner to fasten the semiconductor chip.

Another method of the invention of manufacturing a semiconductor device preferably comprises a positioning step that positions: two corners at both ends of a side of the first semiconductor chip, the side facing to the second semiconductor chip; a side of the first semiconductor chip, the side being not in direct contact with the two corners; two corners at both ends of a side of the second semiconductor chip, the side facing to the first semiconductor chip; and a side of the second semiconductor chip, the side being not in direct contact with the two corners.

This construction of the method of the invention makes each of the first semiconductor chip and the second semiconductor chip positioned at one side and two corners to fasten the semiconductor chip.

The method of the invention of manufacturing a semiconductor device preferably comprises: a first step of disposing the first joining material, the first semiconductor chip, and the third joining material sequentially laminated on the conductive pattern, and disposing the second joining material, the second semiconductor chip, and the fourth joining material sequentially laminated on the conductive pattern; a second step of placing the terminal on the third joining material and the fourth joining material; the positioning step; a reflow step of reflow treatment of the semiconductor device assembled until this moment; the steps being conducted in this order; wherein the positioning step is performed by inserting a positioning member into a through-hole formed in the terminal for determining relative positions of the first semiconductor chip and the second semiconductor chip with respect to the terminal.

This construction of the method of the invention makes the semiconductor chip that has been shifted restore its normal position by the positioning member that is inserted into the through-hole.

A positioning jig of the invention for use in manufacturing a semiconductor device comprising a first semiconductor chip with a rectangular shape and a second semiconductor chip with a rectangular shape separated with each other provided on a circuit board comprises: a first positioning member having an opening capable of inserting the first semiconductor chip and the second semiconductor chip through the opening and having a penetrating space formed in at least a part of a region between the first semiconductor chip and the second semiconductor chip; a second positioning member having an opening capable of inserting the first semiconductor chip and the second semiconductor chip through the opening and positioning a terminal that has a through-hole and has a width narrower than the width of the penetrating space above a place between the first semiconductor chip and the second semiconductor chip so that the terminal extends over the first semiconductor chip and the second semiconductor chip, the second positioning member disposed on the first positioning member; and a third positioning member inserted through the through-hole into the penetrating space in the first positioning member for positioning the first semiconductor chip and the second semiconductor chip.

This construction of a positioning jig of the invention allows the first positioning member to be removed after connecting the terminal, which is smaller than the opening space in the first positioning member, to the semiconductor chip.

In the positioning jig of the invention stated above, materials of the first positioning member, the second positioning member, and the third positioning member are preferably carbon.

This construction of the positioning jig prevents the positioning jig from joining with the joining member because carbon hardly joins with the joining member of a soft solder and brazing filler metal.

According to the present invention, in a semiconductor device having a plurality of small sized semiconductor chips connected in parallel between an insulated circuit board having a conductive pattern and a terminal, the semiconductor chips can be positioned to the insulated circuit board having a conductive pattern with a high accuracy by positioning the corner(s) of the semiconductor chips that is not positioned with a first positioning member, by using a stick that is a third positioning member.

BRIEF DESCRIPTION OF THE DRAWINGS

FIGS. 2A, 2B and 2C are sectional views of a part of the positioning jig 100, wherein FIG. 2A is a sectional view cut along the line X-X indicated in FIG. 1, FIG. 2B is a sectional view cut along the line Y1-Y1 indicated in FIG. 1, FIG. 2C is a sectional view cut along the line Y2-Y2 indicated in FIG. 1;

FIGS. 3A, 3B, and 3C show a construction of a first positioning member 7, wherein FIG. 3A is a plan view of a part, FIG. 3B is a sectional view of a part cut along the line X-X indicated in FIG. 3A, and FIG. 3C is a sectional view of a part cut along the line Y-Y indicated in FIG. 3A;

FIGS. 4A, 4B, and 4C show a construction of a second positioning member 15, wherein FIG. 4A is a plan view of a part, FIG. 4B is a sectional view of a part cut along the line X-X indicated in FIG. 4A, and FIG. 4C is a sectional view of a part cut along the line Y-Y indicated in FIG. 4A;

FIGS. 5A and 5B show a construction of a third positioning member 21, wherein FIG. 5A is a plan view of a part, and FIG. 5B is a sectional view of a part cut along the line X-X indicated in FIG. 5A;

FIGS. 7A, 7B, and 7C illustrate some examples of configurations of the stick 21a;

FIGS. 8A and 8B show a construction of a semiconductor device 200 according to second embodiment example of the invention, wherein FIG. 8A is a plan view of a part of the whole of the semiconductor device 200, and FIG. 8B is a side view of a part seen from the direction indicated by the arrow G in FIG. 8A;

FIGS. 9A and 9B show a step in a method of manufacturing a semiconductor device according to a third embodiment example of the present invention, wherein FIG. 9A is a plan view of a part of the whole construction, and FIG. 9B is a sectional view of a part cut along the line X-X indicated in FIG. 9A;

FIGS. 10A and 10B show a step following the step of FIGS. 9A and 9B in a method of manufacturing a semiconductor device according to the third embodiment example of the present invention, wherein FIG. 10A is a plan view of a part of the whole construction, and FIG. 10B is a sectional view of a part cut along the line X-X indicated in FIG. 10A;

FIGS. 11A and 11B show a step following the step of FIGS. 10A and 10B in a method of manufacturing a semiconductor device according to the third embodiment example of the present invention, wherein FIG. 11A is a plan view of a part of the whole construction, and FIG. 11B is a sectional view of a part cut along the line X-X indicated in FIG. 11A;

FIGS. 12A and 12B show a step following the step of FIGS. 11A and 11B in a method of manufacturing a semiconductor device according to the third embodiment example of the present invention, wherein FIG. 12A is a plan view of a part of the whole construction, and FIG. 12B is a sectional view of a part cut along the line X-X indicated in FIG. 12A;

FIGS. 13A and 13B show a step following the step of FIGS. 12A and 12B in a method of manufacturing a semiconductor device according to the third embodiment example of the present invention, wherein FIG. 13A is a plan view of a part of the whole construction, and FIG. 13B is a sectional view of a part cut along the line X-X indicated in FIG. 13A;

FIGS. 14A and 14B show a step following the step of FIGS. 13A and 13B in a method of manufacturing a semiconductor device according to the third embodiment example of the present invention, wherein FIG. 14A is a plan view of a part of the whole construction, and FIG. 14B is a sectional view of a part cut along the line X-X indicated in FIG. 14A;

FIGS. 15A and 15B show a step following the step of FIGS. 14A and 14B in a method of manufacturing a semiconductor device according to the third embodiment example of the present invention, wherein FIG. 15A is a plan view of a part of the whole construction, and FIG. 15B is a sectional view of a part seen from the direction of the arrow G indicated in FIG. 15A;

FIGS. 16A and 16B show a construction of a conventional power semiconductor module 500, wherein FIG. 16A is a plan view of a part of the semiconductor module 500, and FIG. 16B is a side view of a part seen from the direction indicated by the arrow A in FIG. 16A;

FIGS. 18A and 18B show a construction of a positioning jig 70 having a plurality of, six in this example, first openings 71 corresponding to the number of small sized SiC diode chips 81, wherein FIG. 18A is a plan view corresponding to FIG. 17, and FIG. 18B is an enlarged view of the region F in FIG. 18A.

DETAILED DESCRIPTION OF THE INVENTION

Some preferred embodiments of the present invention will be described in detail in the following with reference to the accompanying drawings. A description that a member is in contact with another member should be understood to include the situation in which a gap with an allowable tolerance exists. It should be noted that the present invention is not limited to the following embodiment examples but can be applied to variations and modifications within the spirit and scope of the present invention.

First Embodiment Example

A positioning jig described in this first embodiment example is a positioning jig for use in manufacturing a semiconductor device comprising a first semiconductor chip with a rectangular shape and a second semiconductor chip with a rectangular shape separated with each other provided on a circuit board, the positioning jig comprising: a first positioning member having an opening capable of inserting the first semiconductor chip and the second semiconductor chip through the opening and having a penetrating space formed in at least a part of a region between the first semiconductor chip and the second semiconductor chip; a second positioning member having an opening capable of inserting the first semiconductor chip and the second semiconductor chip through the opening and positioning a terminal that has a through-hole and has a width narrower than the width of the penetrating space above a place between the first semiconductor chip and the second semiconductor chip so that the terminal extends over the first semiconductor chip and the second semiconductor chip, the second positioning member disposed on the first positioning member; and a third positioning member inserted through the through-hole into the penetrating space for positioning the first semiconductor chip and the second semiconductor chip.

Figure 1:
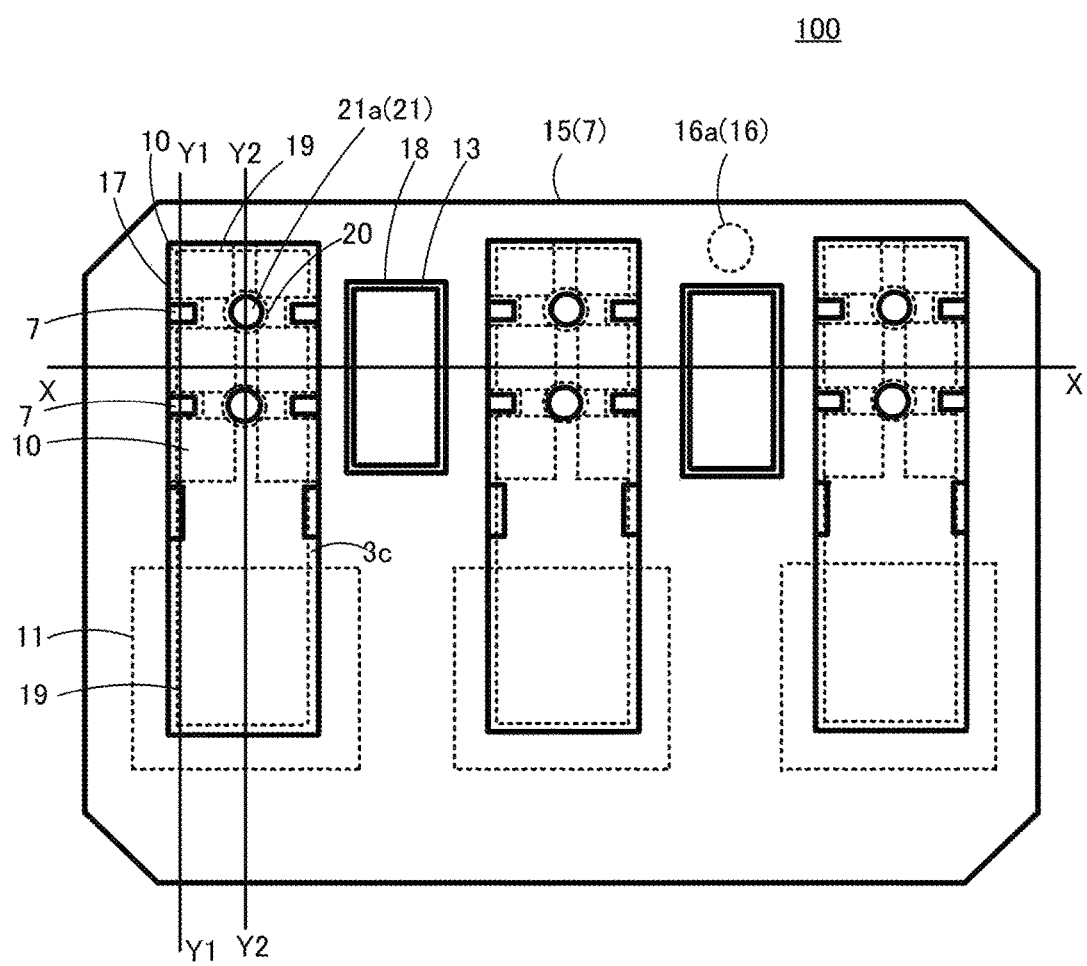
FIG. 1 is a plan view of a part of the whole of a positioning jig 100 according to a first embodiment example of the invention.

FIG. 1 is a plan view of a part of whole of a positioning jig 100 according to the first embodiment example of the present invention. A first terminal and SiC diode chips are indicated by dotted lines.

Figure 2A:
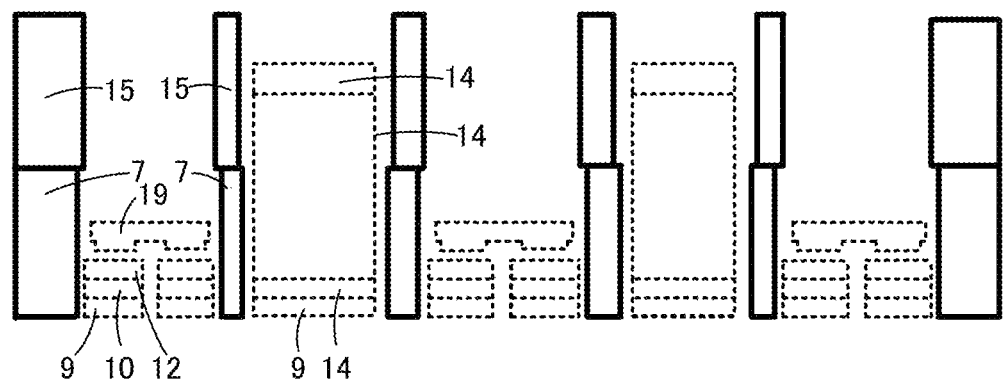
Figure 2B:
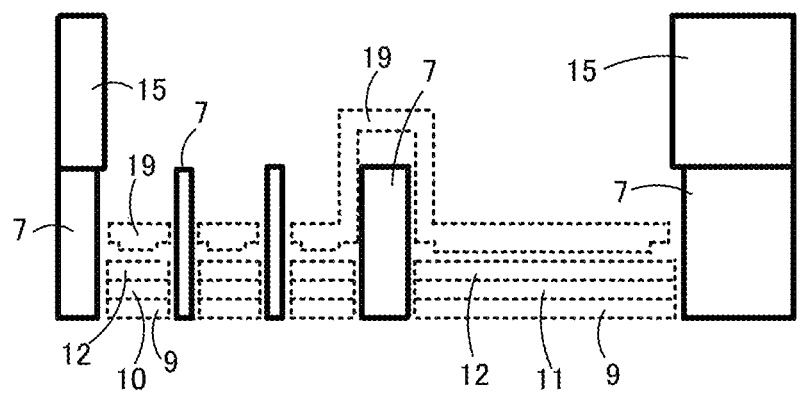
Figure 2C:
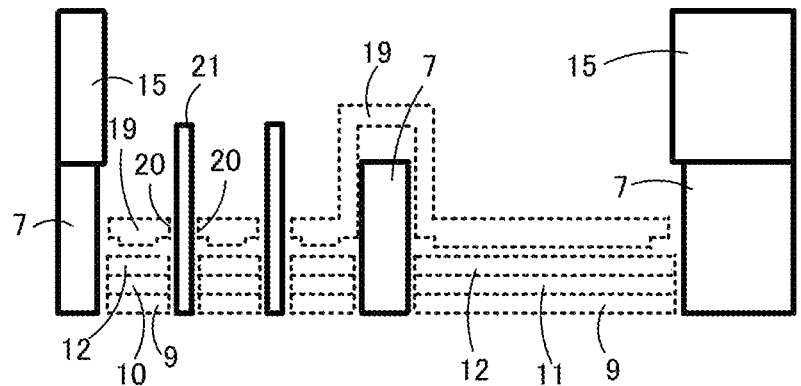

FIG. 2A is a sectional view of a part of the positioning jig 100 cut long the line X-X indicated in FIG. 1; FIG. 2B is a sectional view of a part of the positioning jig 100 cut long the line Y1-Y1 indicated in FIG. 1; and FIG. 2C is a sectional view of a part of the positioning jig 100 cut long the line Y2-Y2 indicated in FIG. 1.

The positioning jig 100 shown in FIG. 1 and FIGS. 2A, 2B and 2C comprises three positioning members 7, 15, and 21. A first positioning member 7 is used for positioning SiC diode chips 10, IGBT chips 11, and second terminals 14, all of which are connected to a conductive pattern 6 with solder at the back surfaces of those chips and terminals. (The conductive pattern is not indicated in FIGS. 1, 2A, 2B, and 2C, but indicated in FIG. 8.)

The first positioning member 7 is also used for positioning solder plates 9 and 12. A second positioning member 15 is used for positioning a first terminal 19 connected to the front surfaces of the SiC diode chips 10 and the IGBT chips 11. The following describes the positioning members 7, 15, and 21.

Figure 3A:
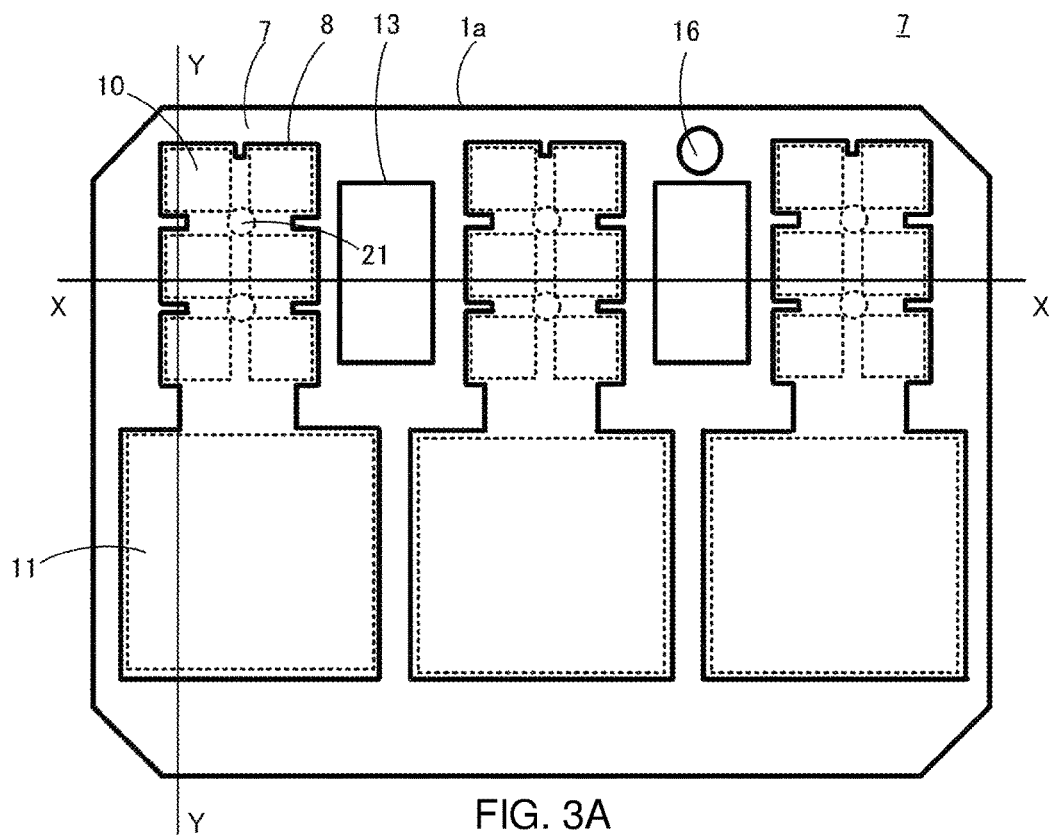
Figure 3B:
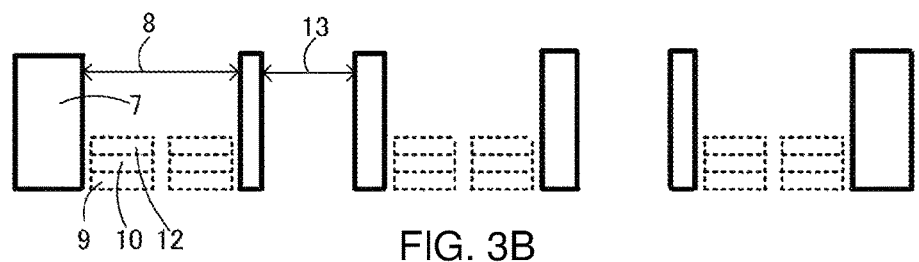
Figure 3C:
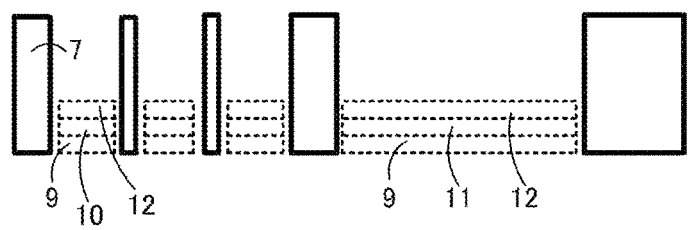

FIG. 3A, FIG. 3B and FIG. 3C show a construction of the first positioning member 7, wherein FIG. 3A is a plan view of a part of the first positioning member 7; FIG. 3B is a sectional view of a part of the first positioning member 7 cut along the line X-X indicated in FIG. 3A; and FIG. 3C is a sectional view of a part of the first positioning member 7 cut along the line Y-Y indicated in FIG. 3A.

The first positioning member 7 positions the SiC diode chips 10, the IGBT chips 11, and the second terminals 14, and positions simultaneously three sets of chips, each set including six SiC diode chips 10 and one IGBT chip 11.

Figure 6:
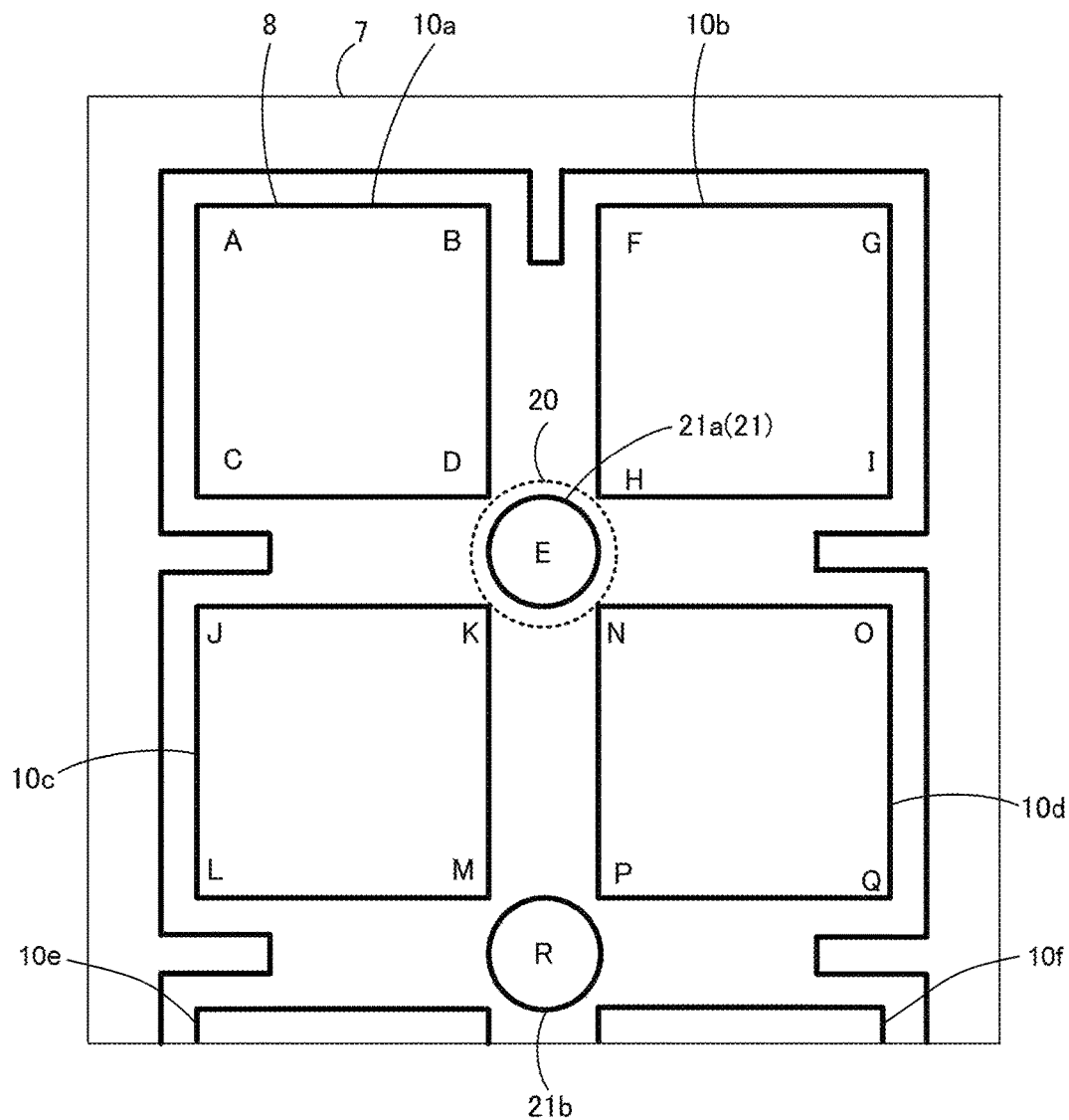
FIG. 6 illustrates positioning method of SiC diode chips 10a through 10d using a stick 21a, which is a third positioning member 21.

The first positioning member 7 has, in a carbon plate 1a, one first opening 8 for positioning six SiC diode chips 10 and one IGBT chip 11, and a second opening 13 for positioning the second terminal 14 connected to the conductive pattern 6. Three first openings 8, for example, are arranged in parallel and separated with each other. The first opening 8 can position, as shown in FIG. 6, three corners A, B, and C of a SiC diode chip 10a, but the one corner D remains not positioned. FIG. 6 also shows that two corners J and L of the SiC diode chip 10c are positioned, but two corners K and M remains not positioned. Thus, the positioning of the SiC diode chips 10 is incomplete without additional means. If soldering is conducted in this configuration, the SiC diode chip 10 would rotate or shift floating on the molten solder, and may become in contact with the adjacent SiC diode chip 10. As a result, the molten solder runs over the front surface of the SiC diode chip 10, deteriorating breakdown voltage of the SiC diode chip 10 and making the semiconductor device a defective product.

The recessed part 16 indicated in FIG. 3A receives a protruding part 16a for positioning the second positioning member 15. The third positioning member 21 positions a corner of the SiC diode chip 10 and is inserted into a through-hole 20 formed in the first terminal 19 indicated in FIGS. 4A, 4B, and 4C.

Figure 4A:
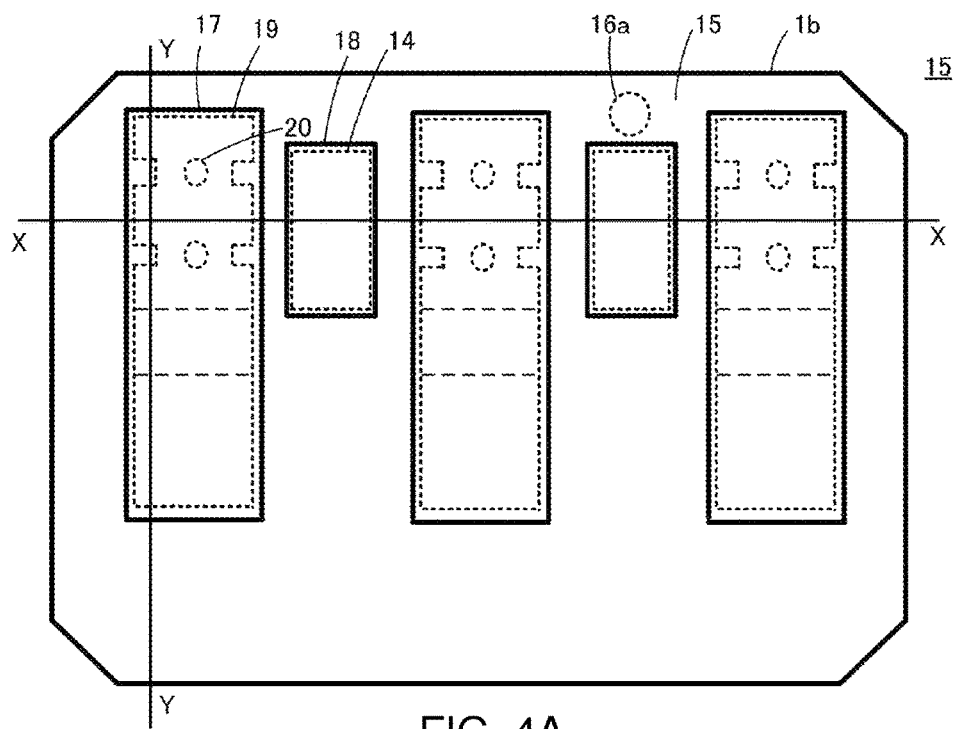
Figure 4B:
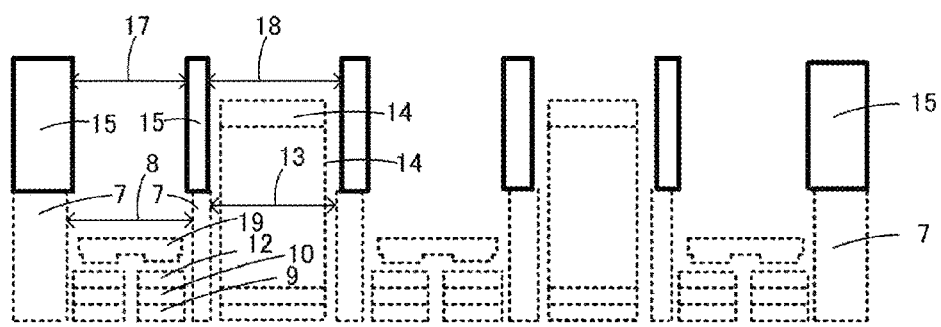
Figure 4C:
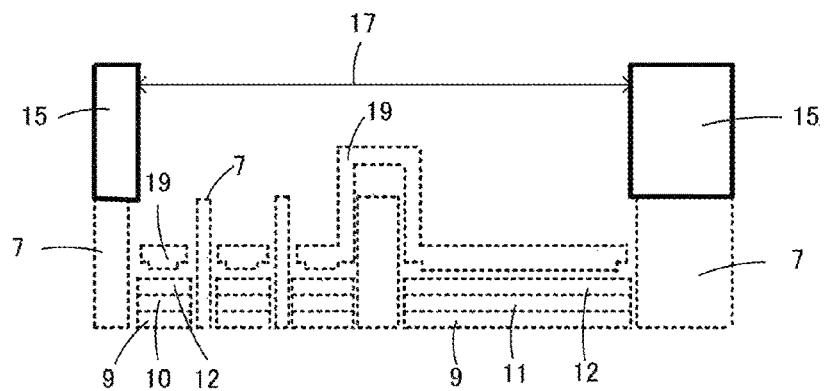

FIG. 4A, FIG. 4B, and FIG. 4C show a construction of a second positioning member 15, wherein FIG. 4A is a plan view of a part of the second positioning member 15; FIG. 4B is a sectional view of a part of the second positioning member 15 cut along the line X-X indicated in FIG. 4A; and FIG. 4C is a sectional view of a part of the second positioning member 15 cut along the line Y-Y indicated in FIG. 4A. The second positioning member 15 has, in a carbon plate 1b, a third opening 17 for positioning the first terminal 19 and a fourth opening 18 for positioning the second terminal 14. The dimension of the fourth opening 18 is slightly larger than the second opening 13, and the dimension of the second opening 13 is slightly larger than that of the second terminal 14. The third opening 17 is disposed on the first opening 8 and positions the first terminal 19.

Figure 5A:
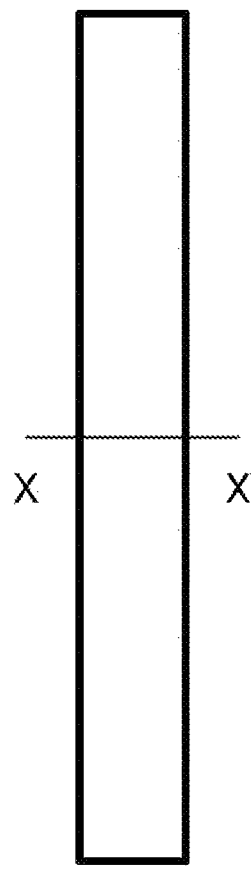
Figure 5B:
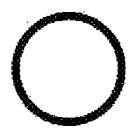

FIG. 5A and FIG. 5B shows a construction of a third positioning member 21, wherein FIG. 5A is a plan view of a part of the third positioning member 21, and FIG. 5B is a sectional view of a part of the third positioning member 21 cut along the line X-X indicated in FIG. 5A.

The third positioning member 21 positions the SiC diode chip 10 in cooperation with the first positioning member 7. The third positioning member 21 is, for example, a stick 21a with a cylindrical shape.

FIG. 6 illustrates positioning of the SiC diode chips 10 using a stick 21a, which is a third positioning member 21. As shown in FIG. 6, the tip of the stick 21a is made in contact with the conductive pattern 6 at the place E where four SiC diode chips 10a, 10b, 10c, and 10d face. In this configuration, the SiC diode chip 10a is in contact with the first positioning member 7 along the side between the corners A and B and along the side between the corners A and C. The corner D of the SiC diode chip 10a is in contact with the tip of the side surface of the stick 21a. The SiC diode chip 10b is in contact with the first positioning member 7 along the side between the corners F and G and along the side between the corners G and I of the SiC diode chip 10b. The corner H of the SiC diode chip 10b is in contact with the tip of the side surface of the stick 21a. The diode chip 10c is in contact with the first positioning member 7 along the side between the corners J and L. The corner K of the SiC diode chip 10c is in contact with the tip of the side surface of the stick 21a, and the corner M of the SiC diode chip 10c is in contact with the tip of the side surface of the stick 21b. The diode chip 10d is in contact with the first positioning member 7 along the side between the corners O and Q. The corner N of the SiC diode chip 10d is in contact with the tip of the side surface of the stick 21a, and the corner P of the SiC diode chip 10d is in contact with the tip of the side surface of the stick 21b. (In FIG. 6, the sticks are depicted with some gap from the neighboring chips for convenience.) The side surface of the tip portion of the stick 21a positions the corners D, H, K and N, and the side surface of the tip portion of the stick 21b positions the corners M and P. Thus, the SiC diode chips 10a and 10b are positioned on the insulated circuit board 3 having a conductive pattern with high accuracy. Consequently, the SiC diode chips 10 are prevented from rotation and shift in the process of soldering. Although FIG. 6 depicts the inside corners of the first positioning member 7 opposing the corners of the semiconductor chips 10a through 10d as formed in a right angle, if it is difficult to cut the inside corners of the first positioning member 7 at right angle, these parts are preferably cut off using a drill. Then, the corners of the semiconductor chips 10a through 10d are not in contact with the inside corners of the first positioning member 7, and thus the working accuracy of the inside corners of the first positioning member 7 does not adversely affect the positioning accuracy, allowing the first positioning member 7 readily manufactured.

Figure 7A:
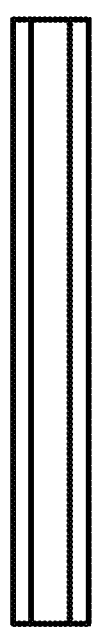
Figure 7A:
Figure 7B:
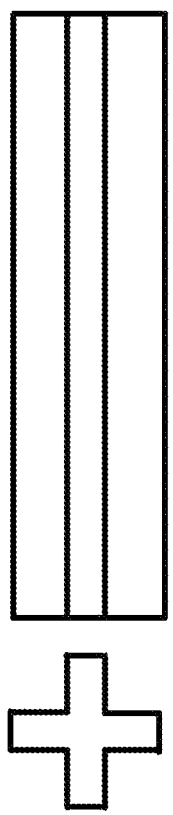
Figure 7B:
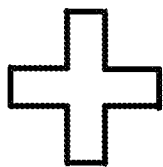
Figure 7C:
Figure 7C:

FIG. 7A, FIG. 7B, and FIG. 7C illustrate other configurations of the stick 21a, wherein FIG. 7A shows a stick with a polygonal cross-section; FIG. 7B shows a stick with a cross-section of a cross; and FIG. 7C shows a stick with a tapered tip. The planar shape of the through-hole 20 of the first terminal 19 into which the stick of FIG. 7A or FIG. 7B is inserted is formed in a similar shape of the cross sectional shape of the stick 21a. The stick with a sectional shape of a cross as shown in FIG. 7B makes the SiC diode chip 10 positioned more precisely by the side surface of the tip portion of the stick 21a as compared with the cross-sectional shapes of circle and polygon and surely avoids positional shift including rotation of the chip in the soldering process.

In the case the tip portion of the stick 21a is tapered as shown in FIG. 7C, the stick 21a can be readily inserted into the through-hole 20.

By using the positioning jig 100 comprising the first positioning member 7, the second positioning member 15, and the third positioning member 21, and the through-hole 20 formed in the first terminal 19, the multiple small-sized SiC diode chips 10 are positioned with high accuracy to the conductive pattern 6 and the first terminal 19, and the assembled intermediate product can be soldered in a reflow furnace.

Second Embodiment Example

The semiconductor device of the second embodiment example of the present invention comprises: an insulated circuit board having a conductive pattern; a first semiconductor chip with a rectangular shape connected through a first joining material to the conductive pattern; a second semiconductor chip with a rectangular shape disposed on the conductive pattern separated from the first semiconductor chip and connected through a second joining material to the conductive pattern; a terminal disposed above the first semiconductor chip and the second semiconductor chip, connected to the first semiconductor chip through a third joining material, and connected to the second semiconductor chip through a fourth joining material, the terminal having a through-hole above a place between the first semiconductor chip and the second semiconductor chip.

Figure 8A:
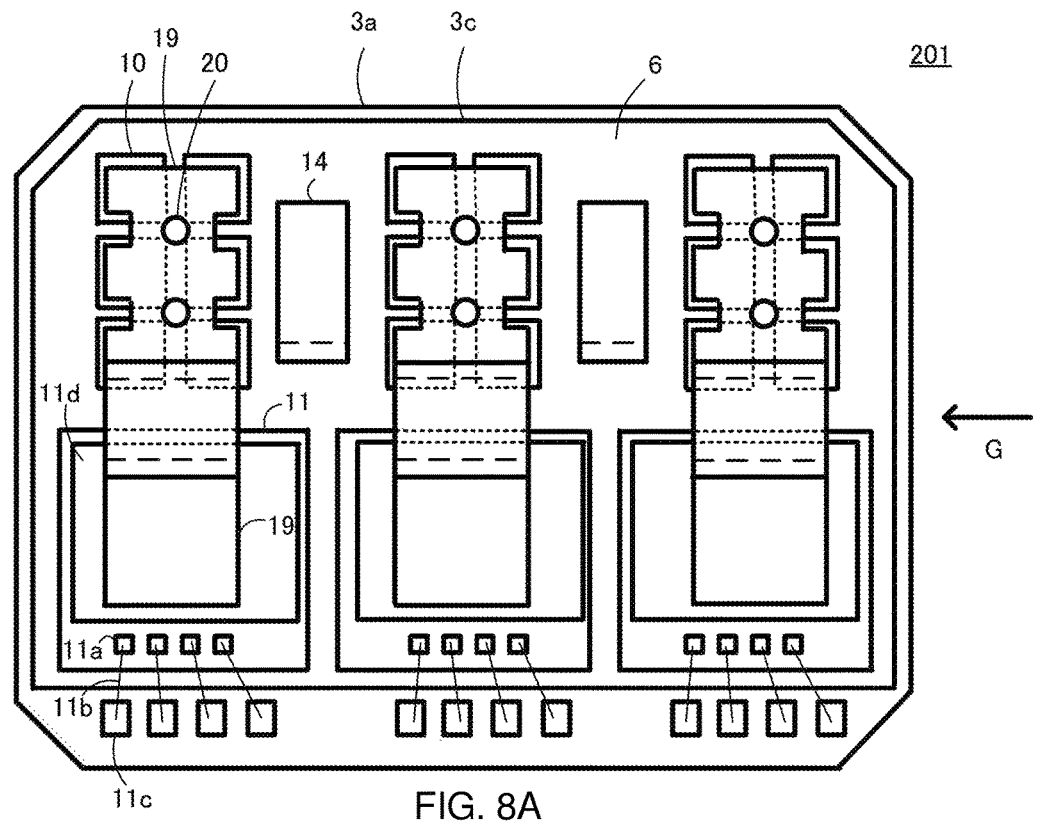
Figure 8B:
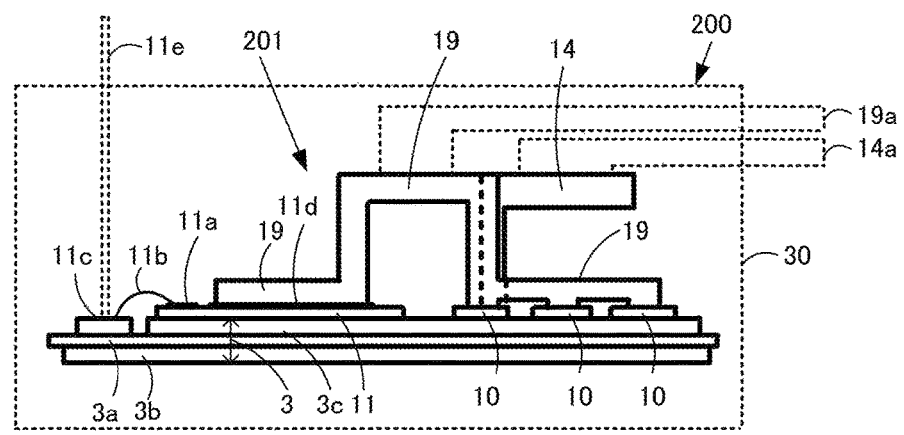

FIG. 8A and FIG. 8B show a construction of a semiconductor device of a second embodiment example of the present invention, wherein FIG. 8A is a plan view of a part of the whole semiconductor device 200, and FIG. 8B is a side view of a part of the semiconductor device 200 seen from the direction G indicated in FIG. 8A. These figures show a construction of a power cell 201.

This semiconductor device 200 comprises: an insulated circuit board 3 having a conductive pattern forming a conductive foil 3b on the back surface of an insulation plate 3a and a conductive pattern 3c formed on a front surface of the insulation plate 3a, and three sets of six SiC diode chips 10 and one IGBT chip 11 connected on the conductive pattern 3c with a solder (not depicted in the figure) and a first terminal 19 connected onto the front surfaces of the six SiC diode chips 10 and one IGBT chip 11 with a solder (not depicted in the figure).

The present invention provides a construction for positioning semiconductor chips irrespective of the type of the semiconductor chip. In the Second Embodiment Example, the first semiconductor chip and the second semiconductor chip mentioned above are two adjacent SiC diode chips 10.

The power cell 201 has the first terminals 19 connected to the six SiC diode chips 10 and one IGBT chip 11 arranged in parallel three rows and two second terminals 14 connected to the conductive pattern 3c with solder. The power cell 201 further comprises bonding wires 11b connecting gate electrode pads 11a and pad electrodes 11c. Thus, a power cell is manufactured. A semiconductor device 200 is manufactured by connecting the three first terminals 19 of the power cell 201 with a conductor antiparallel-connecting the diodes, which functions as free-wheeling diodes, and the IGBTs.

A control pin 11e, which is a control terminal, is connected to the pad electrode 11c, a first externally leading out terminal 19a is connected to the first terminal 19, and a second externally leading out terminal 14a is connected to the second terminal 14. The whole of the semiconductor device 200 is sealed with a resin 30 exposing the tip of the control pin 11e, the tip of the first externally leading out terminal 19a, and the tip of the second externally leading out terminal 14a. Thus, a semiconductor device 200 is completed.

The power cells 201 is arranged three in a column and two in a row, that is, 3×2 arrangement, and the second externally leading out terminals 19a are connected to a first terminal and the second externally leading out terminals 14a are connected to a second terminal. After sealing with resin 30 exposing the tips of the eternally leading out terminals 19a, and 14a, and the tip of the control pins 11e, a semiconductor device 200 is completed having six independent power cells installed in one casing of resin 30.

Using a plurality of the semiconductor devices 200, one of various circuits, such as an inverter, can be constructed. For example, the power cells 201 are arranged vertically and the first terminal 19 of the upper power cell 201 and the second terminal 14 of the lower power cell 201 are connected with a conductor, then one phase of an inverter circuit is constructed of series-connected upper and lower power cells 201. Three sets of the set of upper and lower power cells are arranged and each of the conductors connecting the first terminal 19 of the upper power cell 201 and the second terminal 14 of the lower power cell 201 is connected to an externally leading out terminal. The three externally leading out terminals are extracted as the terminals of U, V and W phase. When the first terminals 19 of all the upper power cells 201 are connected to an externally leading out terminal, then the externally leading out terminal is an N terminal; and when the second terminals 14 of all the lower power cells 201 are connected to another externally leading out terminal, the externally leading out terminal is a P terminal. Thus, a semiconductor device constructing a three phase inverter circuit is obtained.

In the semiconductor device 200 of the present invention, each of the three first terminals 19 has a through hole 20 formed for inserting a stick 21a, which is a third positioning member 21, used for positioning the SiC diode chips 10. This through-hole 20 is disposed above the place E at which the corners of the four SiC diode chips 10 faces with each other as shown in FIG. 6.

Third Embodiment Example

A method of manufacturing a semiconductor device of the third embodiment example of the present invention is a method of manufacturing a semiconductor device that comprises: an insulated circuit board having a conductive pattern; a first semiconductor chip with a rectangular shape connected through a first joining material to the conductive pattern; a second semiconductor chip with a rectangular shape disposed on the conductive pattern separated from the first semiconductor chip and connected through a second joining material to the conductive pattern; a terminal disposed above the first semiconductor chip and the second semiconductor chip, connected to the first semiconductor chip through a third joining material, and connected to the second semiconductor chip through a fourth joining material; the terminal having a through-hole above a place between the first semiconductor chip and the second semiconductor chip; the method comprising a positioning step in which the first semiconductor chip is positioned at at least three places, the second semiconductor chip is positioned at at least three places, and at least one of the three positioning places is positioned with a positioning member inserted into the through-hole.

More specifically, a method, of the present invention, of manufacturing a semiconductor device includes the following two aspects.

The first aspect comprises a positioning step that positions: two sides composing a corner of the first semiconductor chip; two sides composing a corner of the second semiconductor chip, the corner being not facing to the first semiconductor chip; a corner at a diagonal position of the corner of the first semiconductor chip; and a corner at a diagonal position of the corner of the second semiconductor chip.

The second aspect comprises a positioning step that positions: two corners at both ends of a side of the first semiconductor chip, the side facing to the second semiconductor chip; a side of the first semiconductor chip, the side being not in direct contact with the two corners; two corners at both ends of a side of the second semiconductor chip, the side facing to the first semiconductor chip; and a side of the second semiconductor chip, the side being not in direct contact with the two corners.

FIG. 6 illustrates positioning of a plurality of SiC diode chips 10 using the stick 21a, which is a third positioning member 21.

Figure 13A:
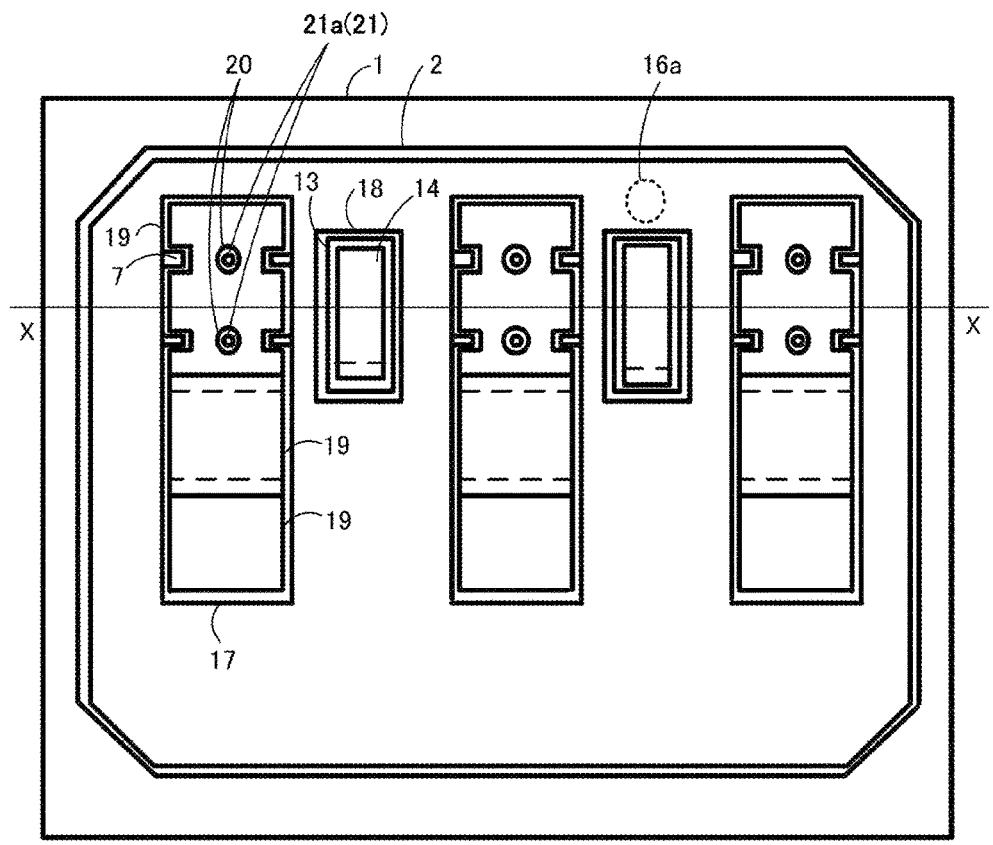
Figure 13B:
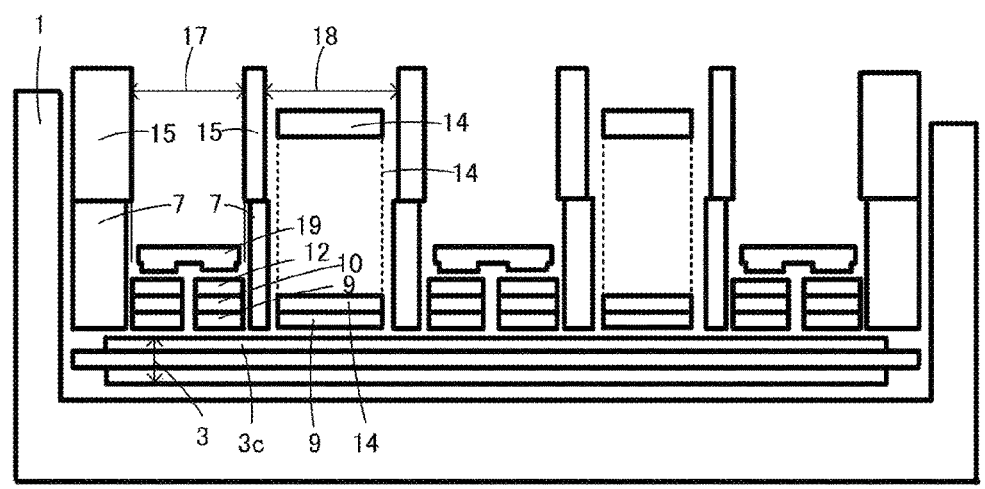
Figure 14A:
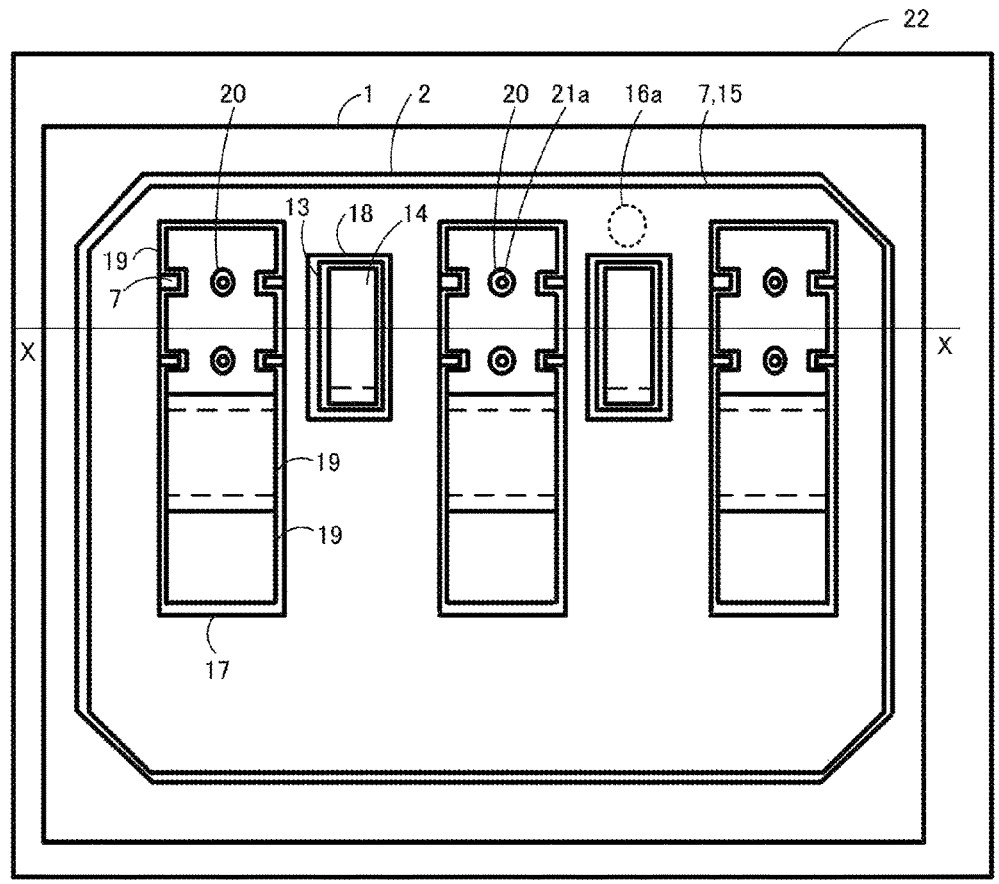
Figure 14B:
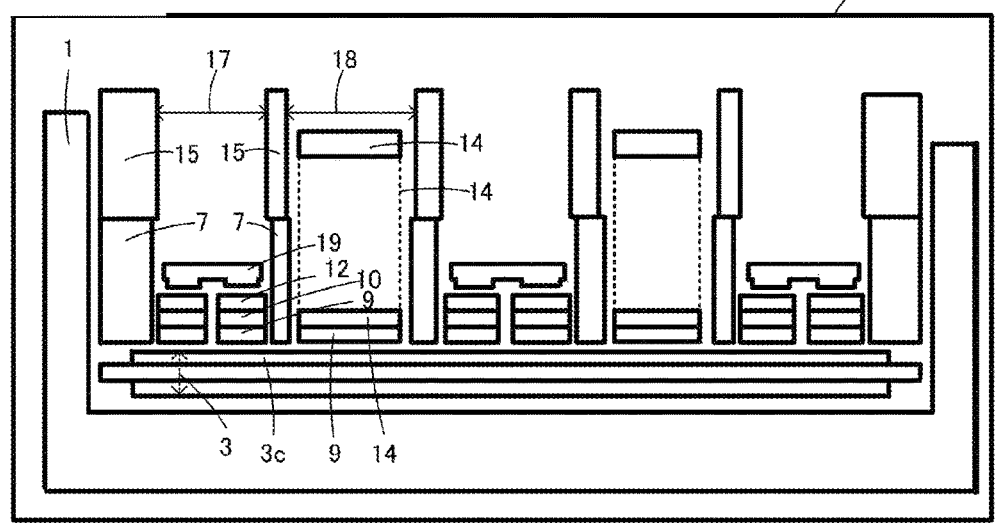
Figure 15A:
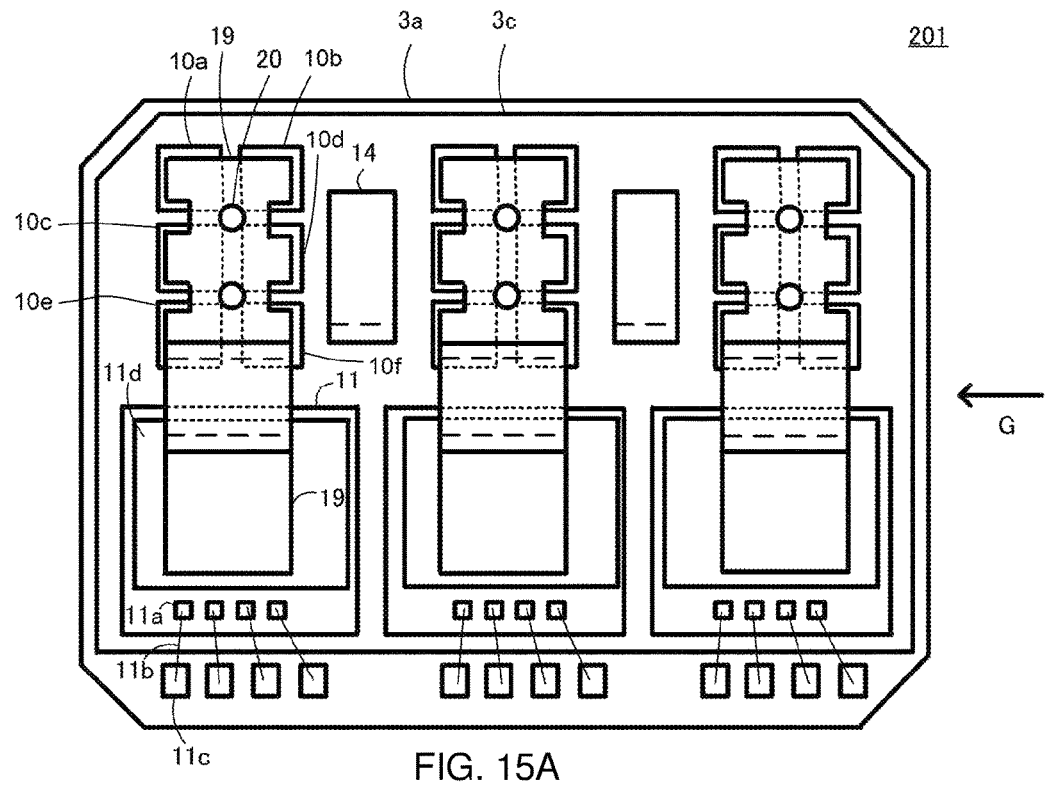
Figure 15B:
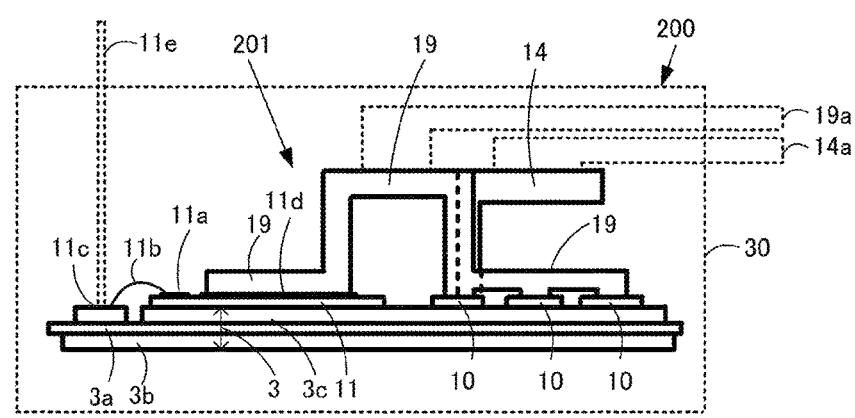
Figure 16A:
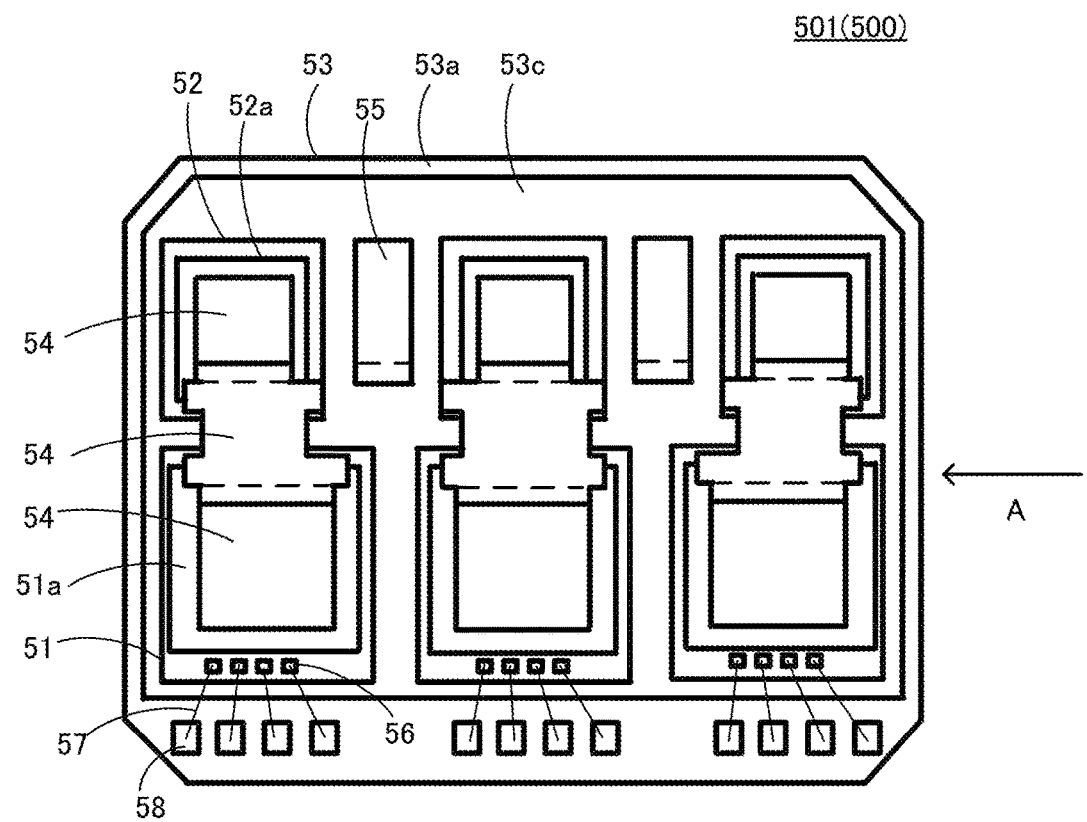
Figure 16B:
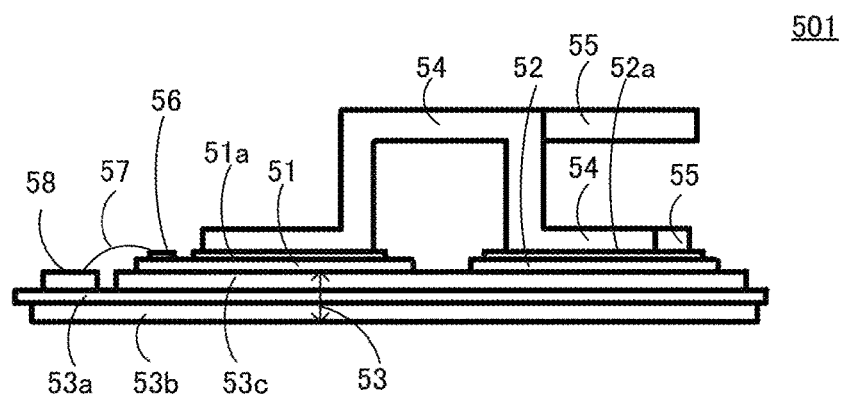
Figure 17:
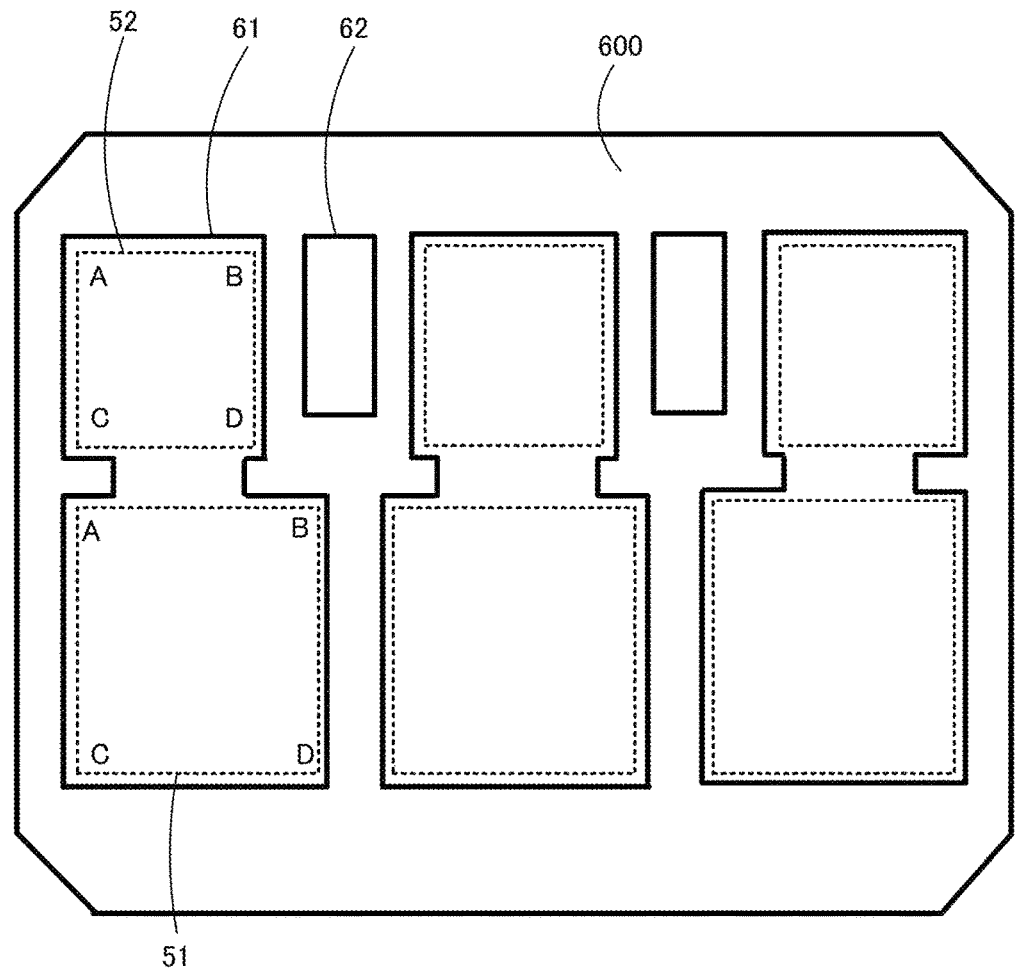
FIG. 17 is a plan view of a part of a positioning jig 600 used for assembling the power semiconductor module 500 of FIGS. 16A and 16B.
Figure 18A:
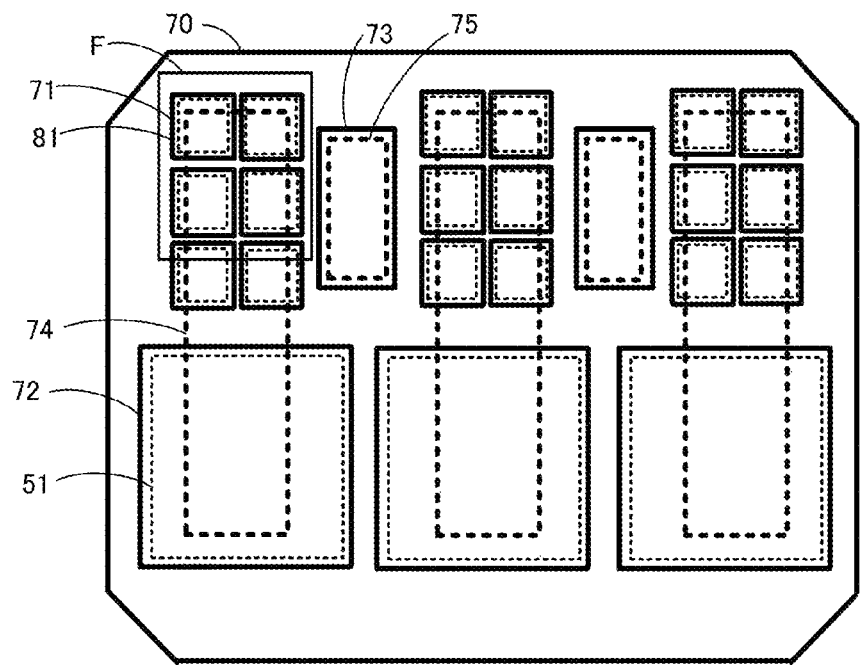
Figure 18B:
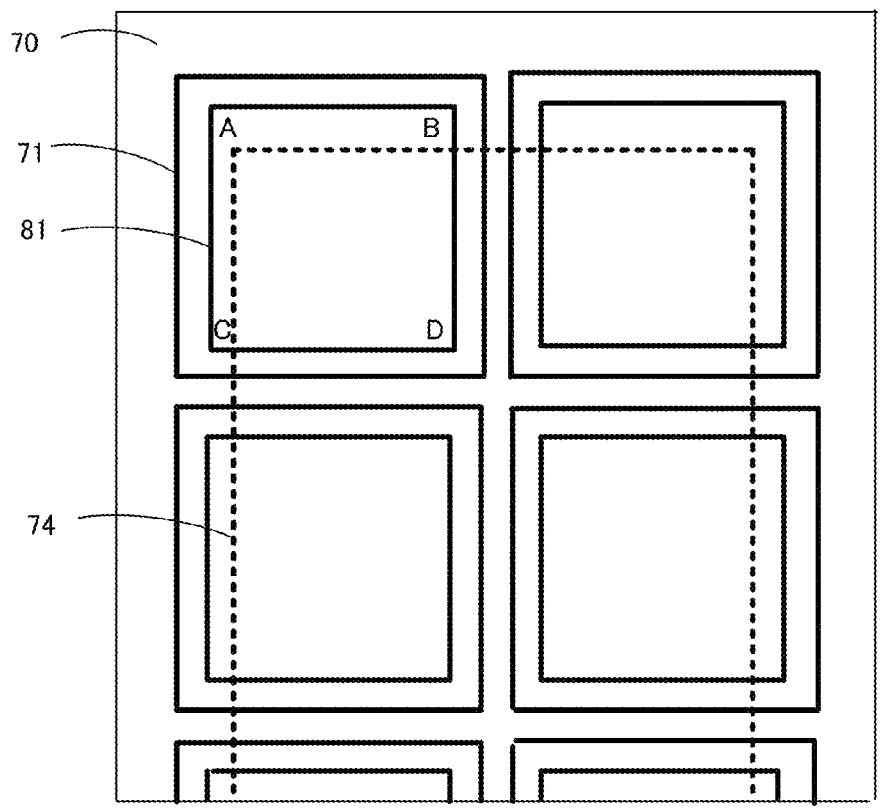
Figure 19:
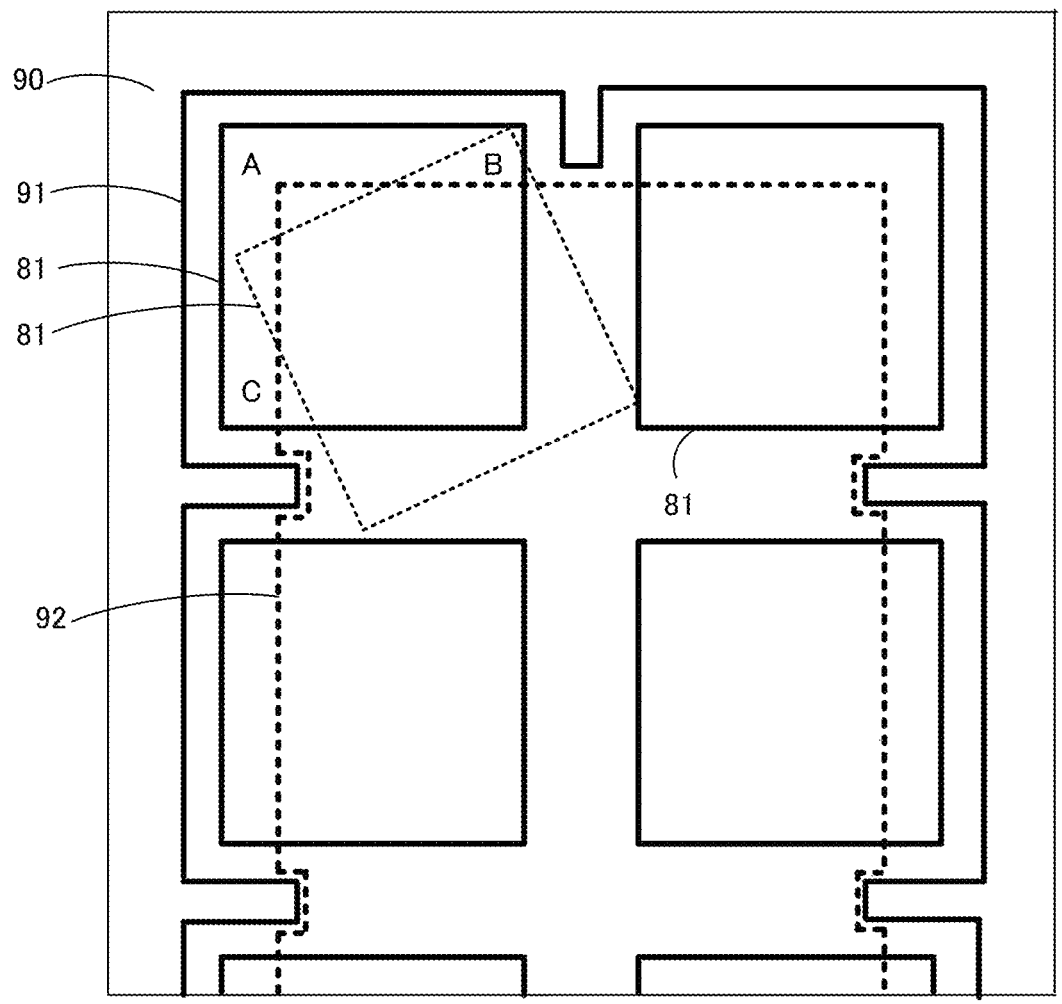
FIG. 19 is a plan view of a part of a positioning jig 90 that allows removing itself without obstruction by a first terminal 92.

FIGS. 9A and 9B through FIGS. 15A and 15B shows a method of manufacturing a semiconductor device of the third embodiment of the invention, illustrating in the sequence of manufacturing steps. FIGS. 9A, 10A, 11A, 12A, 13A, 14A, and 15A are plan views of parts. FIGS. 9B, 10B, 11B, 12B, 13B, and 14B are sectional views of parts cut along the line X-X indicated in FIGS. 9A, 10A, 11A, 12A, 13A, and 14A, respectively. FIG. 15B is a side view of a part seen from the direction G indicated in FIG. 15A. These steps assemble a power cell, which is an intermediate product.

Figure 9A:
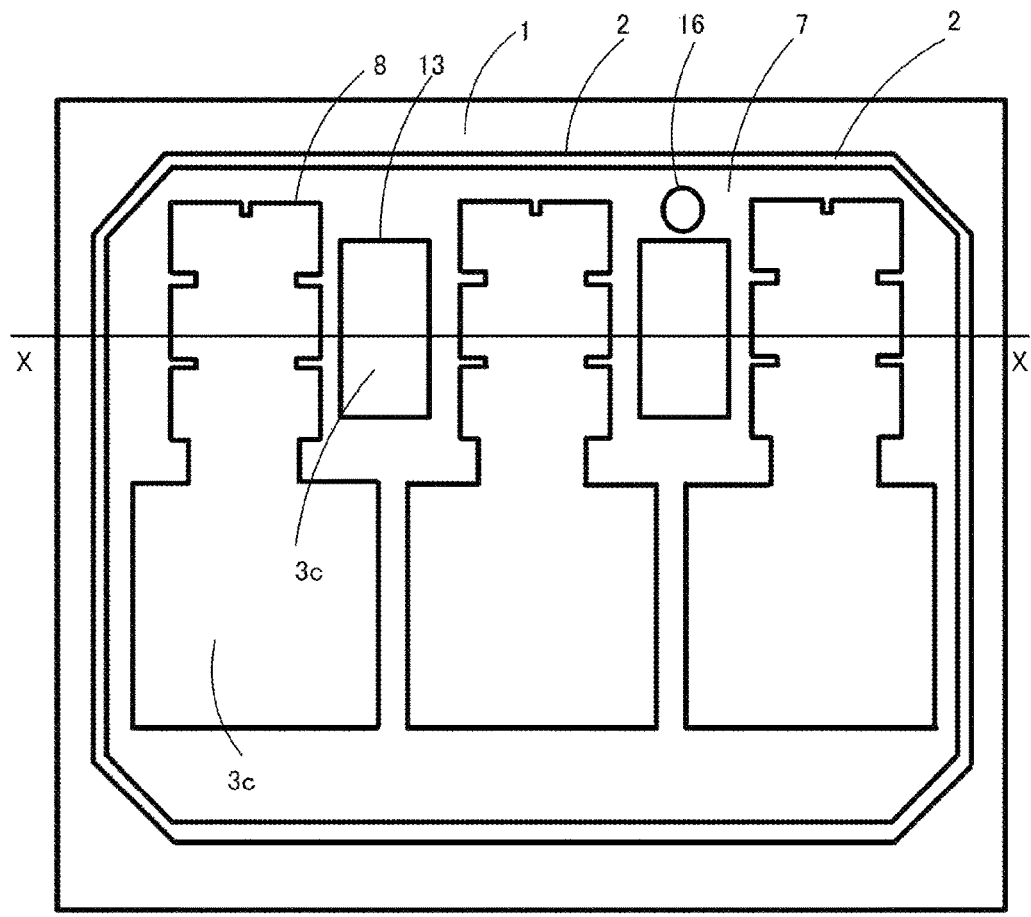
Figure 9B:
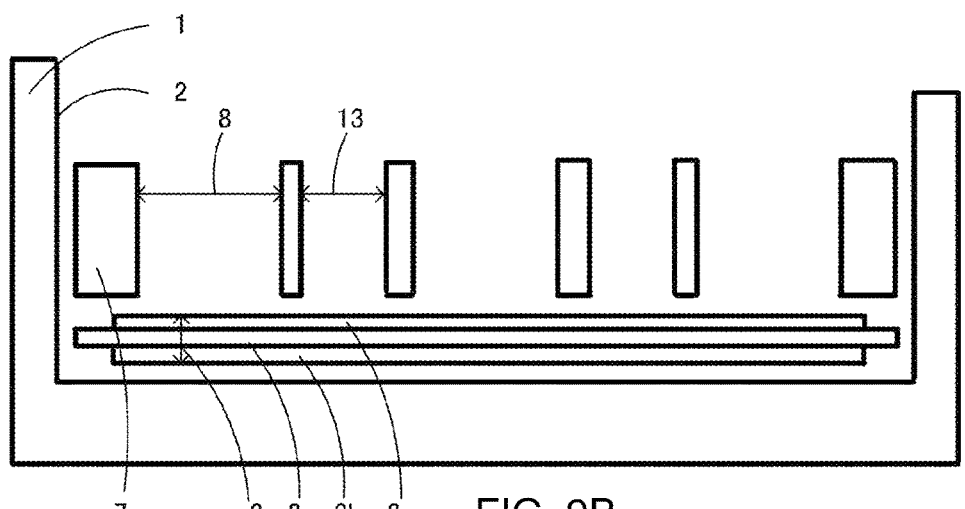

First referring to FIG. 9A and FIG. 9B, an insulated circuit board 3 having a conductive pattern and a first positioning member 7 are put into a recessed part 2 of a carbon plate 1 in this order. More specifically, the carbon plate 1 has an area larger than the insulated circuit board 3 having a conductive pattern. The depth of the recessed part 2 is at least the sum of the thickness of the first positioning member 7 and the thickness of the second positioning member 15. The wall surface of the recessed part 2 guides the positions of the first positioning member 7 and the second positioning member 15. The insulated circuit board 3 having a conductive pattern is composed of an insulation plate 3a, a conductive foil 3b provided on the back surface of the insulation plate 3a, and a conductive pattern 3c provided on the front surface of the insulation plate 3a. Positioning of the first positioning member 7 is conducted by fitting to the recessed part 2 of the carbon plate 1. The first positioning member 7 has a circular recessed part 16 used for positioning the second positioning member 15 relative to the first positioning member 7. The recessed part 16 and the protruding part 16a are disposed at a position that is not rotationally symmetric with respect to the relative position of the first positioning member 7 and the second positioning member 15. Consequently, the second positioning member 15 is unable to situate at a position of 180 degrees of rotation relative to the first positioning member 7.

Figure 10A:
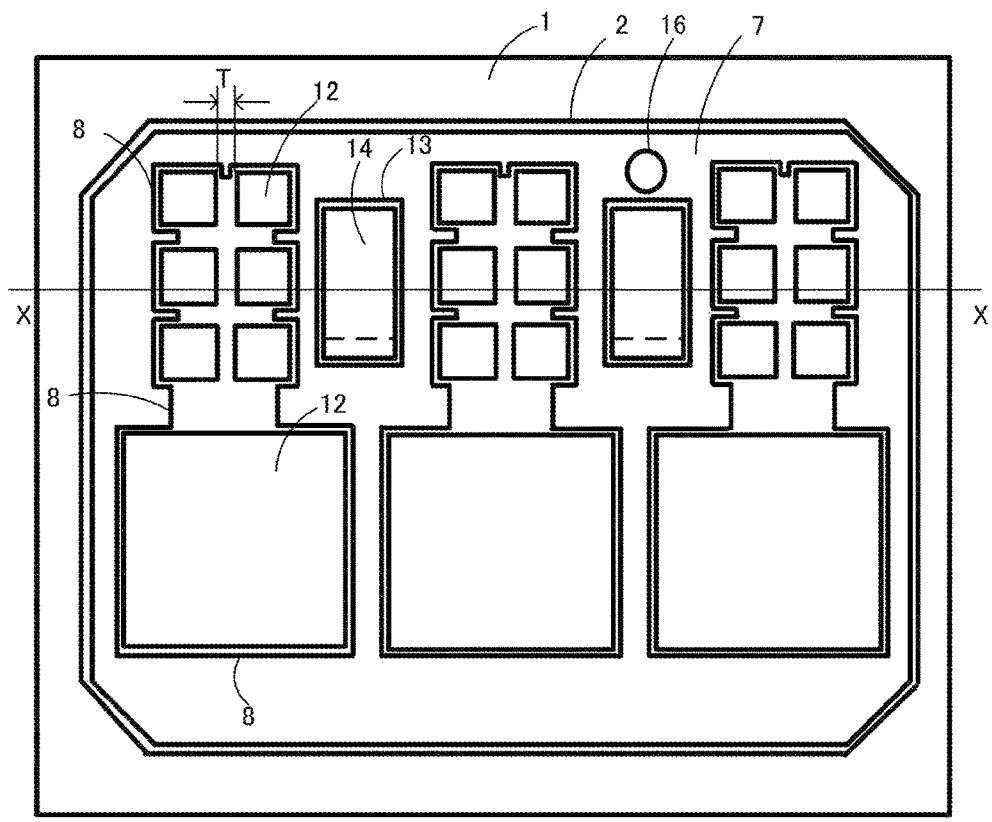
Figure 10B:
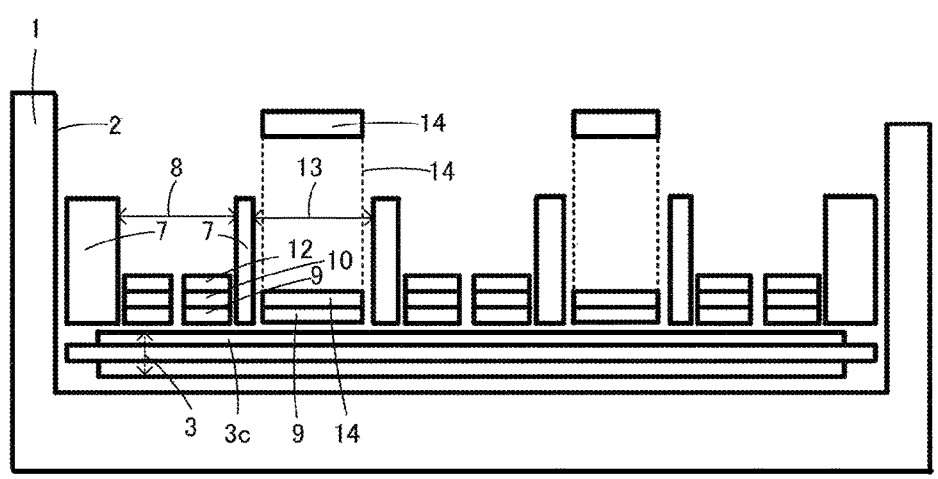

Then, referring to FIGS. 10A and 10B, solder plates 9, SiC diode chips 10 and solder plates 12 are sequentially stacked in this order in a part of a first opening 8 of the first positioning member 7 for arranging the SiC diode chips 10. A solder plate 9, an IGBT chip 11, and a solder plate 12 are sequentially stacked in this order in a part of the first opening 8 of the first positioning member 7 for arranging the IGBT chip 11. A solder plate 9 and a second terminal 14 are placed in a second opening 13.

Figure 11A:
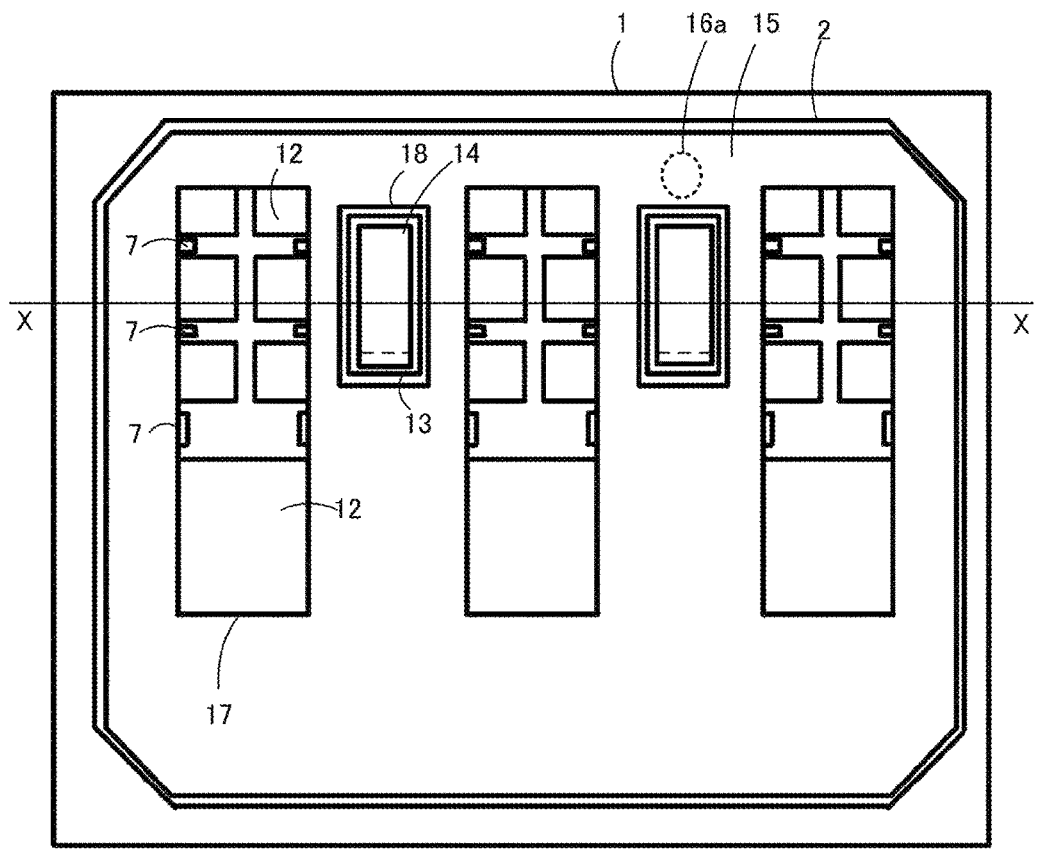
Figure 11B:
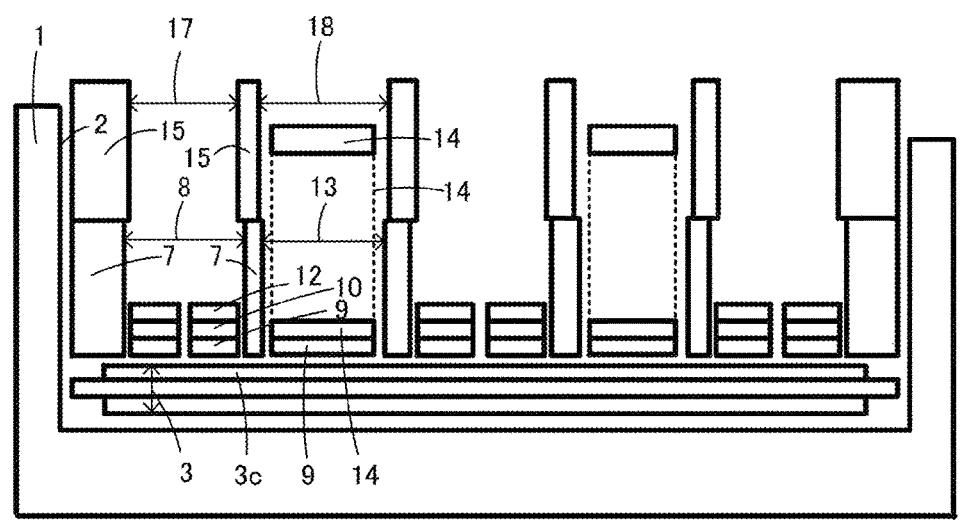

Then, referring to FIGS. 11A and 11B, the second positioning member 15 is inserted into the recessed part 2 of the carbon plate 1 and put on the first positioning member 7. In this process, the protruding part 16a with a cylindrical shape formed at the bottom of the second positioning member 15 is coupled to the recessed part second metallic line 16 with a circular shape of the first positioning member 7. The positioning of the second positioning member 15 is performed by the recessed part 2 of the carbon plate 1, the recessed part 16 of the first positioning member 7, and the protruding part 16a of the second positioning member 15. The second positioning member 15 has a third opening 17 and a fourth opening 18. The width of the third opening 17 is determined at a width for positioning a first terminal 19. The width of the opening 18 is larger than the width of the second opening 13 so that the second positioning member 15 does not come into contact with the second terminal 14, which has been disposed in the second opening 13.

Figure 12A:
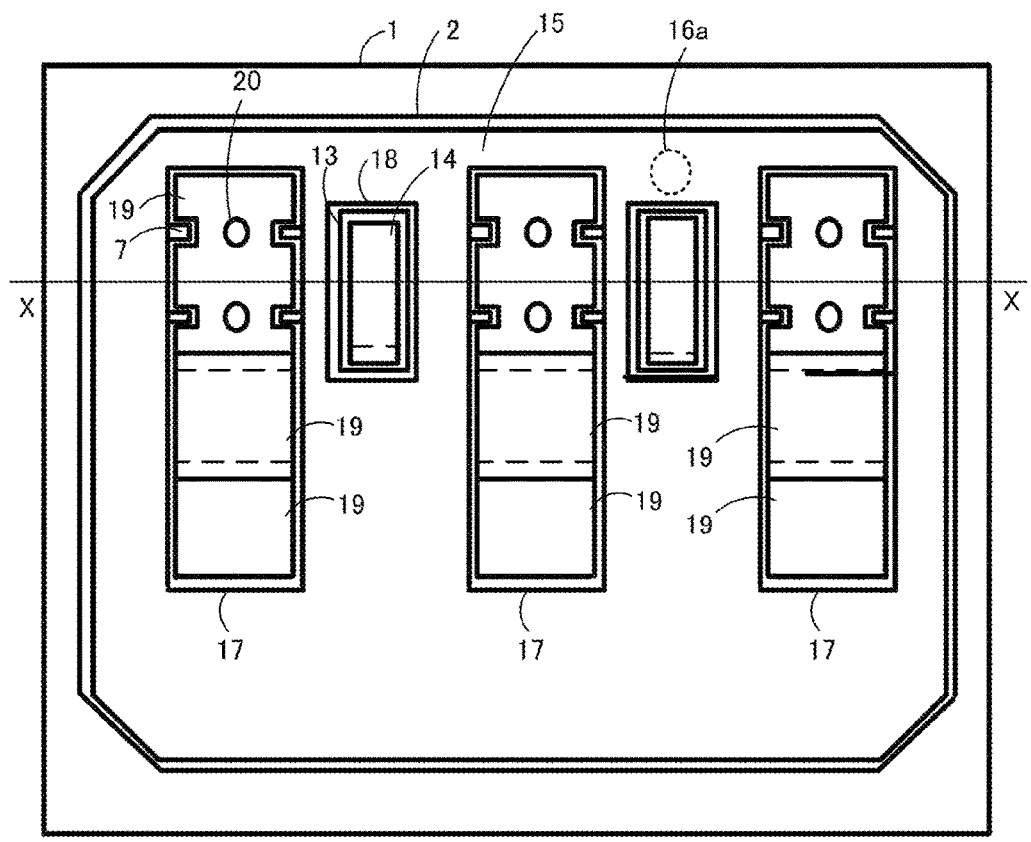
Figure 12B:
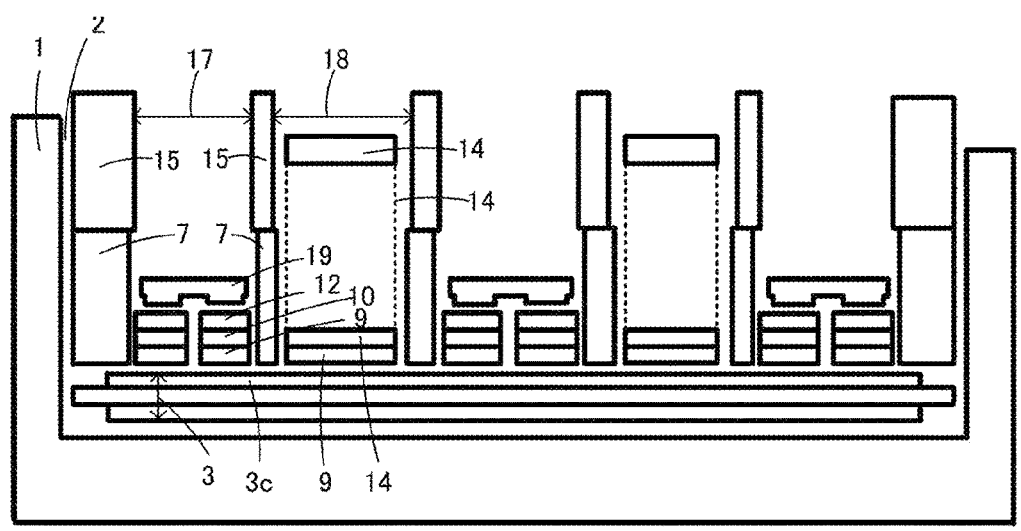

Then, referring to FIGS. 12A and 12B, the first terminals 19 are put through the three third openings 17, arranged in parallel, of the second positioning member 15 on the solder plate 12 disposed in the first openings 8 of the first positioning member 7.

Then, referring to FIGS. 13A and 13B, a stick 21a, which is a third positioning member 21, is inserted into a through-hole 20 formed in the first terminal 19. As a result as shown in FIG. 6, the tip of the stick 21a comes into contact with the conductive pattern 6 at the place E at which four SiC diode chips 10a, 10b, 10c, and 10d are facing to each other. Of the SiC diode chip 10a in this arrangement, the side between the corner A and the corner B of the SiC diode chip 10a and the side between the corner A and the corner C are in contact with the first positioning member 7, and the corner D of the SiC diode chip 10a is in contact with the tip of the side surface of the stick 21a. Of the SiC diode chip 10b in this arrangement, the side between the corner F and the corner G of the SiC diode chip 10b and the side between the corner G and the corner I are in contact with the first positioning member 7, and the corner H of the SiC diode chip 10b is in contact with the tip of the side surface of the stick 21a. Of the SiC diode chip 10c in this arrangement, the side between the corner J and the corner L of the SiC diode chip 10c is in contact with the first positioning member 7, and the corner K of the SiC diode chip 10c is in contact with the tip of the side surface of the stick 21a, and the corner M of the SiC diode chip 10c is in contact with the tip of the side surface of the stick 21b. Of the SiC diode chip 10d in this arrangement, the side between the corner O and the corner Q of the SiC diode chip 10d is in contact with the first positioning member 7, the corner N of the SiC diode chip 10d is in contact with the tip of the side surface of the stick 21a, and the corner P of the SiC diode chip 10d is in contact with the tip of the side surface of the stick 21b. (For convenience, FIG. 6 depicts as though there is a gap between the members "in contact" with each other.) The tip of the side surface of the stick 21a positions the corners D, H, K, and N, and the tip of the side surface of the stick 21b positions the corners M and P. Consequently, the SiC diode chips 10a and 10b can be positioned with a high accuracy and soldered on the insulated circuit board 3 having a conductive pattern.

Then, referring to FIGS. 14A and 14B, the carbon plate 1 and all the components mounted on the carbon plate 1 are put into a reflow furnace 22, the components including the insulated circuit board 3 having a conductive pattern, the semiconductor chips 10a through 10d, and 11, the solder plates 9 and 12, the first terminal 19, the second terminal 14, and the positioning jig 100 composed of the positioning members 7, 15, and 21. The solder plates 9 and 12 are melted and then solidified to join the SiC diode chips 10a through 10d, the IGBT chip 11, the conductive pattern 6, the first terminal 19, and the second terminal 14 at respective appropriate places. The SiC diode chips 10a through 10d floating on the molten solder are each held at three places as described above avoiding rotation or shifting thereof. Therefore, the SiC chips are firmly positioned and solder-jointed.

Then, referring to FIGS. 15A and 15B, the carbon plate 1, and the positioning jig 100 and the soldered components mounted on the carbon plate 1 are extracted from the reflow furnace 22, the soldered components including the insulated circuit board 3 having a conductive pattern, the chips 10 (including chips 10a through 10f) and 11, the first terminal 19 and the second terminal 14. Then the stick 21a is pulled out of the through-hole 20, and the positioning members 7 and 8 are removed. After that, an end of the bonding wire 11b is connected to the gate electrode pad 11a of the IGBT chip 11 and the other end is connected to the pad electrode 11c. Thus a power cell 201 is completed. The emitter electrode 11d of the IGBT chip 11 has been joined to the first terminal 19 with solder.

Then, a control pin 11e, which is a control terminal, is connected to the pad electrode 11c; a first externally leading out terminal 19a is connected to the first terminal 19; and a second externally leading out terminal 14a is connected to the second terminal 14. The whole device assembled until this stage is sealed with resin 30, with the tips of the externally leading out terminals 19a and 14a and the tips of the control pins 11e exposed to the air. Thus, a semiconductor device 200 is completed.

When the first terminal 19 used in the manufacturing process is preliminarily applied with solder, the solder plate 12 does not need to be provided on the front surface of the chips 10 and 11. At the stage of completion of the power cell 201, tests are conducted to exclude defective products, and then sealing with resin is performed to finish manufacturing a semiconductor device 200. This procedure enhances the rate of non-defective products.

More description will be given in the following about the method of positioning the SiC diode chips 10 using the first positioning member 7 and the stick 21a, which is the third positioning member 21.

The stick 21a is inserted into the through-hole 20 of the first terminal 19 to make the tip of the stick 21a in contact with the conductive pattern 6 at the position E at which the four SiC diode chips 10 faces to each other. Positioning of the SiC diode chips 10a is performed with the tip of the side surface of the stick 21a in contact with the corner D of the SiC diode chip 10a. Thus, the SiC diode chip 10a is prevented from positional shift by using the stick 21a, which is a third positioning member 21, and the first positioning member 7.

If a SiC diode chip 10 comes into contact with another SiC diode chip 10, the molten solder goes over the chip surface. Accordingly, a gap T between the sides of opposing chips 10 is made to be at least 0.2 mm.

However, an excessively wide gap creates large dead space. Consequently, the gap T is preferably not larger than 2 mm. The gap is more preferably in the range from 0.5 mm to 1.5 mm.

One of the points of the present invention is that SiC diode chips 10 are positioned using a stick 21a, which is a third positioning member 21, inserted into a through-hole 20 formed in a first terminal 19. One of the features of a semiconductor device 200 is that the first terminal 19 has a through-hole 20 formed in the first terminal 19.

The present invention can be effectively applied to the case in which an insulated circuit board having a conductive pattern, semiconductor chips including SiC diode chips 10 and an IGBT chip 11, and a first terminal 19, which can be a lead-frame made of copper, are soldered altogether on a heat radiation plate such as copper base.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

DESCRIPTION OF SYMBOLS 1, 1a, 1b: carbon plate
2, 16: recessed part
3, 53: insulated circuit board having a conductive pattern
3a, 53a: insulation plate
3b, 53b: conductive film
3c, 53c: conductive pattern
7: first positioning member
8, 61, 71: first opening
9: solder plate
10, 10a, 10b, 10c, 10d, 10e, 10f, 52, 81: SiC diode chip
11, 51: IGBT chip
11a, 56: gate electrode pad
11b, 57: bonding wire
11c, 58: pad electrode
11d, 51a: emitter electrode
11e: control pin
12: solder plate
13, 62, 72: second opening
14, 55, 75: second terminal
14a: second externally leading out terminal
15: second positioning member
16a: protruding part
17, 73: third opening
18: fourth opening
19, 54, 74, 92: first terminal 19a: first externally leading out terminal
20: through-hole
21a: stick
21: third positioning member
22: reflow furnace
30: resin
52a: anode electrode
70, 90, 100, 600: positioning jig
91: opening
200: semiconductor device
201, 501: power cell
500: conventional power semiconductor module

What is claimed is:

1. A method of manufacturing a semiconductor device that includes an insulated circuit board having a conductive pattern, a first semiconductor chip with a rectangular shape having first to fourth corner portions, connected through a first joining material to the conductive pattern, a second semiconductor chip with a rectangular shape having first to fourth corner portions, disposed on the conductive pattern separated from the first semiconductor chip and connected through a second joining material to the conductive pattern, a terminal disposed above the first semiconductor chip and the second semiconductor chip to connect the first semiconductor chip to the second semiconductor chip, connected to the first semiconductor chip through a third joining material, and connected to the second semiconductor chip through a fourth joining material, the method comprising
(a) determining a position of the first semiconductor chip using the four corner portions thereof and a position of the second semiconductor chip using the four corner portions thereof, a side face between the third corner portion and the fourth corner portion of the first semiconductor chip facing a side face between the third corner portion and the fourth corner portion of the second semiconductor chip;
(b) performing a reflow process for connecting the first semiconductor chip by the first joining material to the conductive pattern, and the second semiconductor chip by the second joining material to the conductive pattern, wherein
the first and second corner portions of the first semiconductor chip which are the farthest corner portions from the second semiconductor chip, and the first and second corner portions of the second semiconductor chip which are the farthest corner portions from the first semiconductor chip, are positioned with a first positioning member to determine the positions of the first and second semiconductor chips, the first position member providing outermost boundaries for the first and second corner portions of the first and second semiconductor chips during the connecting process and
the third corner portion of the first semiconductor chip and the third corner portion of the second semiconductor chip are the closest corner portions to each other, and are positioned with a second positioning member that is inserted into a first through-hole formed in the terminal at a position between the third corner portions of the first and second semiconductor chips in a plan view of the semiconductor device, the second positioning member providing outermost boundaries for the third corner portions of the first and second semiconductor chips during the connecting process.

2. A method of manufacturing a semiconductor device, comprising:
(a) placing first and second semiconductor chips, each of which has a rectangular shape with four corner portions, on a substrate, with a first positioning structure to determine positions of the first and second semiconductor chips;
(b) placing a positioning terminal over the first and second semiconductor chips to connect the first semiconductor chip to the second semiconductor chip;
(c) inserting a positioning rod into an opening in the positioning terminal to determine the positions of the first and second semiconductor chips, the opening in the positioning terminal being disposed between the first and second semiconductor chips in a plan view of the semiconductor device; and
(d) performing a reflow process for connecting the first and second semiconductor chips to the substrate, wherein
in the step (b) and the step (c), the four corner portions of the first and second semiconductor chips are supported by either the first positioning structure or the positioning rod, the first positioning structure together with the positioning rod thereby providing outermost boundaries of the first and second semiconductor chips to restrict the positions of the first and second semiconductor chips during the step (d),
wherein the steps (a) through (d) are performed in this order.

3. The method of manufacturing a semiconductor device according to claim 1, further comprising the following steps in the indicated order:
a first step of sequentially disposing the first joining material, the first semiconductor chip, and the third joining material on the conductive pattern, and sequentially disposing the second joining material, the second semiconductor chip, and the fourth joining material on the conductive pattern;
a second step of placing the terminal on the third joining material and the fourth joining material; the step (a); and
the step (b), wherein
the step (b) includes a reflow treatment of the semiconductor device assembled through the step (a), and
the step (a) includes inserting the positioning member into the through-hole formed in the terminal for determining relative positions of the first semiconductor chip and the second semiconductor chip with respect to the terminal.

4. The method of manufacturing a semiconductor device according to claim 1, wherein the fourth corner portion of the first semiconductor chip and the fourth corner portion of the second semiconductor chip, which faces the first semiconductor chip, are positioned with an other second positioning member inserted into a second through-hole formed in the terminal at a position between the fourth corner portion of the first semiconductor chip and the fourth corner portion of the second semiconductor chip in the plan view.

5. The method of manufacturing a semiconductor device according to claim 1, wherein the fourth corner portion of the first semiconductor chip and the fourth corner portion of the second semiconductor chip, which faces the first semiconductor chip,
the fourth corner portion of the first semiconductor chip which is an other one of the closest corner portions from the second semiconductor chip, and the fourth corner portion of the second semiconductor chip which is an another one of the closest corner portions from the first semiconductor chip, are positioned with the first positioning member.

6. The method of manufacturing a semiconductor device according to claim 1, wherein the step (a) further includes positioning the terminal with a third positioning member.

7. The method of manufacturing a semiconductor device according to claim 6, wherein the step (a) further includes positioning the third positioning member to overlap the first positioning member with a first engagement portion of the third positioning member and a second engagement portion of the first positioning member.

8. The method of manufacturing a semiconductor device according to claim 2, wherein
  the step (a) includes positioning, with the first positioning member, first and second corner portions of the first semiconductor chip and first and second corner portions of the second semiconductor chip, not facing the first semiconductor chip, and
  the step (c) includes positioning a third corner portion of the first semiconductor chip and a third corner portion of the second semiconductor chip that faces the first semiconductor chip, with the positioning rod inserted into the opening formed in the positioning terminal at a position between the third corner portion of the first semiconductor chip and the third corner portion of the second semiconductor chip in the plan view.

9. The method of manufacturing a semiconductor device according to claim 8, wherein the step (c) further includes positioning a fourth corner portion of the first semiconductor chip and a fourth corner portion of the second semiconductor chip that faces the first semiconductor chip, with another positioning rod inserted into another opening formed in the positioning terminal at a position between the fourth corner portion of the first semiconductor chip and the fourth corner portion of the second semiconductor chip in the plan view.

10. The method of manufacturing a semiconductor device according to claim 8, wherein the step (a) further includes positioning a fourth corner portion of the first semiconductor chip and a fourth corner portion of the second semiconductor chip that faces the first semiconductor chip, with the first positioning structure.

11. The method of manufacturing a semiconductor device according to claim 2, further comprising (d) placing a second positioning structure overlapping the first positioning structure to position the positioning terminal.

12. The method of manufacturing a semiconductor device according to claim 11, wherein the step (d) includes placing the second positioning structure overlapping the first positioning structure with a first engagement portion of the second positioning structure and a second engagement portion of the first positioning structure.

* * * * *